United States Patent
Yajima et al.

(10) Patent No.: US 6,861,344 B2
(45) Date of Patent: Mar. 1, 2005

(54) METHOD OF MANUFACTURING A SEMICONDUCTOR INTEGRATED CIRCUIT DEVICE

(75) Inventors: Akira Yajima, Tsuchiura (JP); Kenichi Yamamoto, Kodaira (JP); Hiromi Abe, Hitachinaka (JP)

(73) Assignee: Renesas Technology Corporation, Tokyo (JP)

( * ) Notice: Subject to any disclaimer, the term of this patent is extended or adjusted under 35 U.S.C. 154(b) by 108 days.

(21) Appl. No.: 10/341,447

(22) Filed: Jan. 14, 2003

(65) Prior Publication Data

US 2003/0153172 A1 Aug. 14, 2003

(30) Foreign Application Priority Data

Feb. 8, 2002 (JP) ........................................ 2002-032379

(51) Int. Cl.[7] ........................ H01L 21/44; H01L 21/66; H01L 21/90; H01L 21/92; H01L 29/78
(52) U.S. Cl. ........................... 438/612; 438/625; 438/14
(58) Field of Search ............................. 438/14, 15, 17, 438/18, 462, 612, 613, 614, 622, 625

(56) References Cited

U.S. PATENT DOCUMENTS

| 6,245,659 | B1 | * | 6/2001 | Ushiyama .................... 438/620 |
| 6,573,113 | B1 | * | 6/2003 | Low et al. .................... 438/18 |
| 6,573,170 | B2 | * | 6/2003 | Aoyagi et al. ............... 438/612 |
| 6,582,983 | B1 | * | 6/2003 | Runyon et al. ............... 438/33 |
| 6,627,548 | B1 | * | 9/2003 | Kruwinus et al. ........... 438/689 |
| 6,660,624 | B2 | * | 12/2003 | Tzeng et al. ................ 438/612 |
| 6,696,353 | B2 | * | 2/2004 | Minn et al. .................. 438/462 |
| 6,727,185 | B1 | * | 4/2004 | Smith et al. ................ 438/727 |

FOREIGN PATENT DOCUMENTS

JP            2000-294607       4/1999

* cited by examiner

*Primary Examiner*—M. Wilczewski
(74) *Attorney, Agent, or Firm*—Reed Smith LLP; Stanley P. Fisher, Esq.; Juan Carlos A. Marquez, Esq.

(57) ABSTRACT

The corrosion of a pad portion on TEG is prevented, and the wettability of a solder and the shear strength after solder formation of a pad portion of an actual device are improved. A third layer wiring M3 on a chip area CA of a semiconductor wafer and a third layer wiring M3 on a scribe area SA are respectively comprised of a TiN film M3$a$, an Al alloy film M3$b$, and a TiN film M3$c$. A second pad portion PAD2 as the top of a rewiring 49 on the chip area CA is cleaned. Alternatively, an Au film 53$a$ is formed thereon by an electroles splating method. Further, after the formation of the Au film 53$a$, a retention test is carried out. Thereafter, further, an Au film 53$b$ is formed and a solder bump electrode 55 is formed. As a result, it is possible to prevent the corrosion of a first pad portion PAD1 of the third layer wiring M3 on the scribe area SA which is TEG due to a plating solution or the like by the TiN film M3$c$. Further, it is possible to improve the wettability of a solder and the shear strength after solder formation of the second pad portion PAD2 by the Au films 53$a$ and 53$b$.

6 Claims, 33 Drawing Sheets

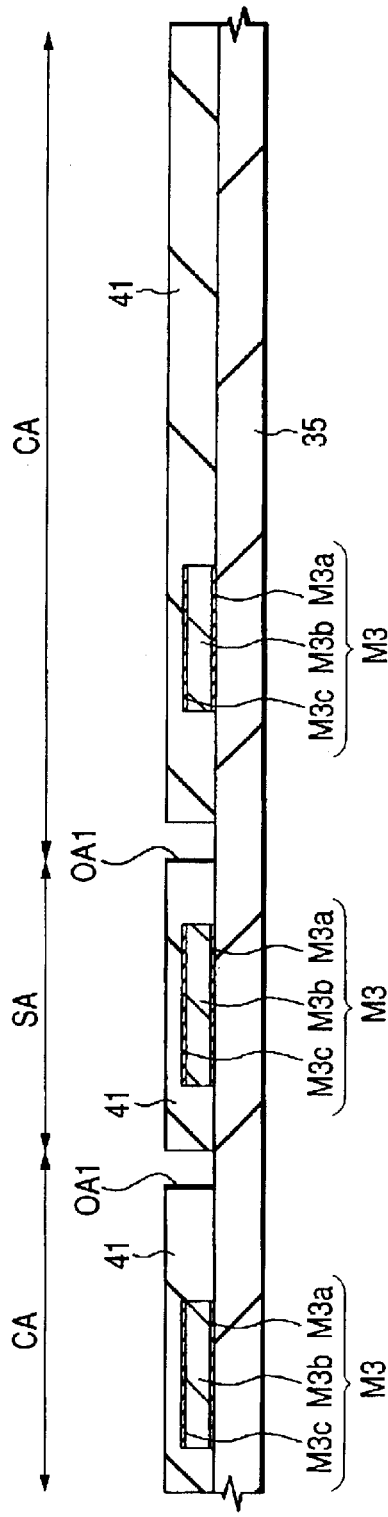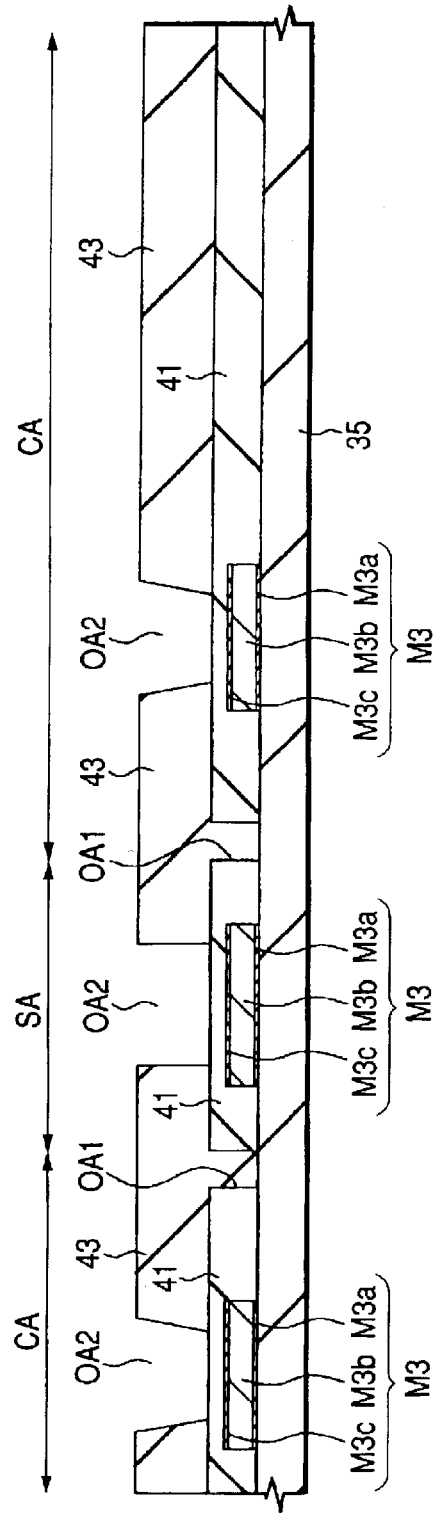

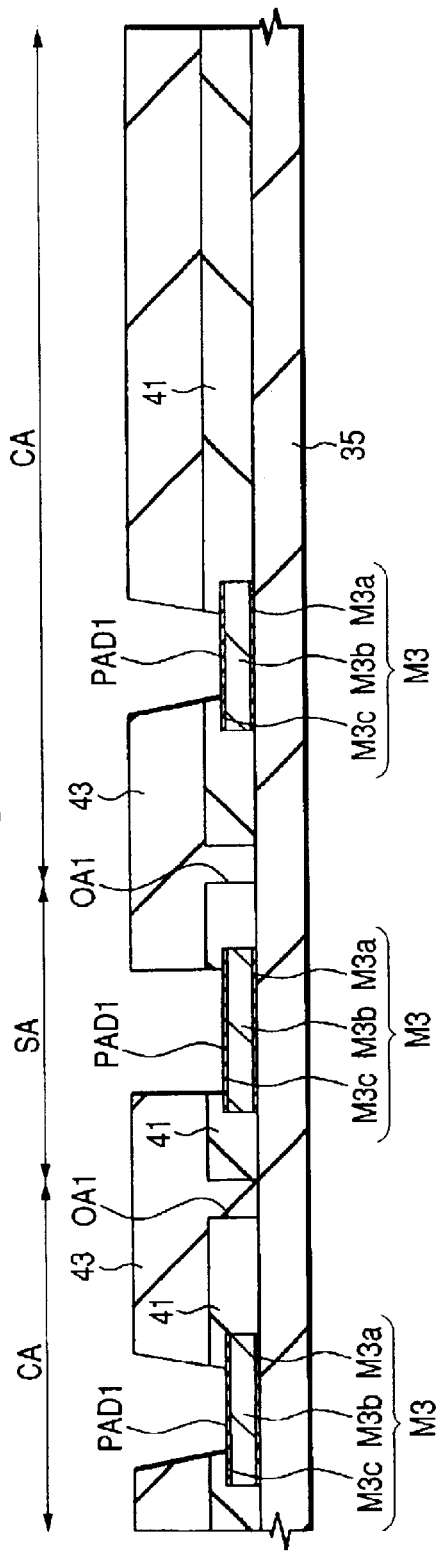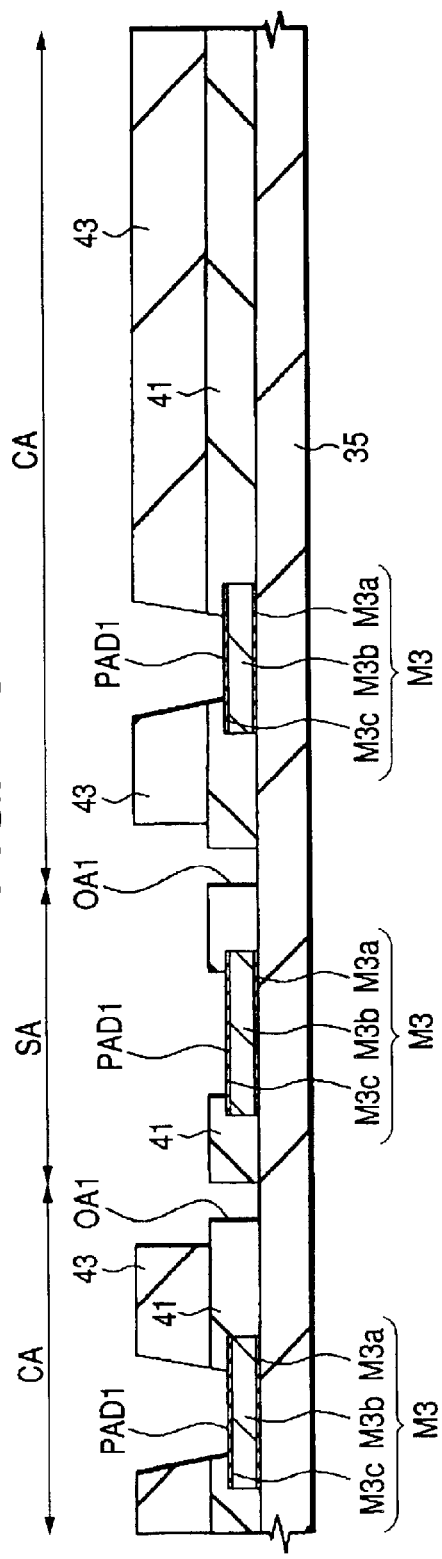

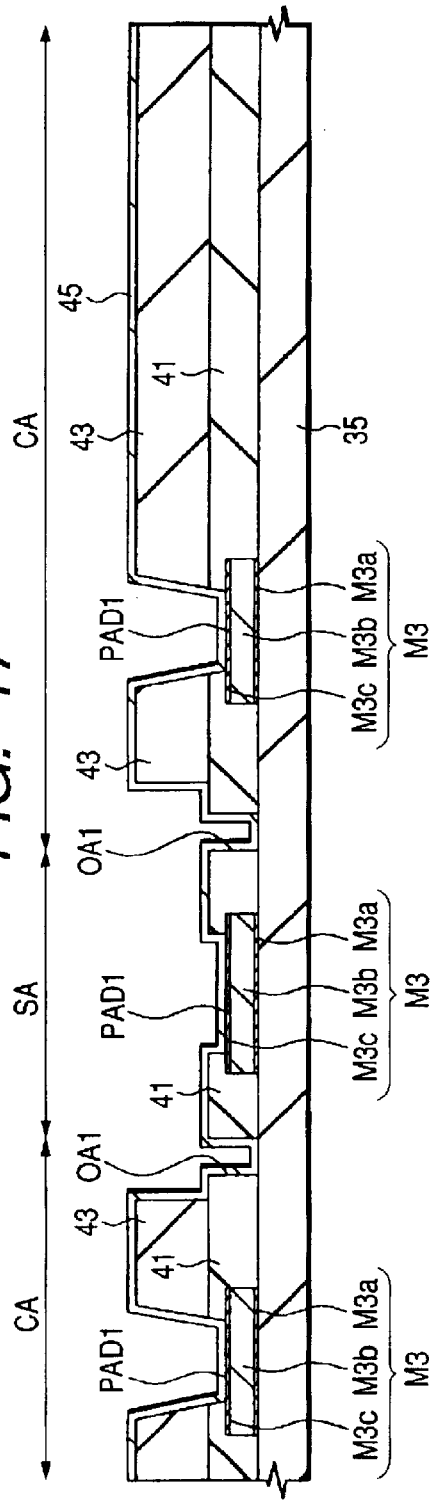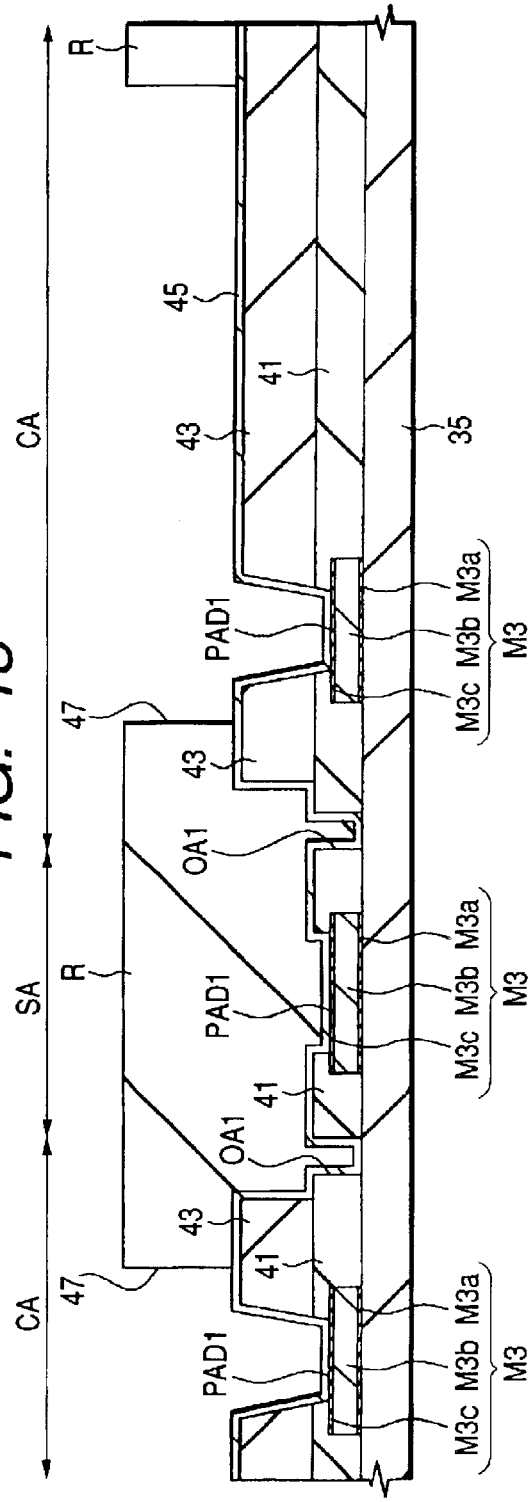

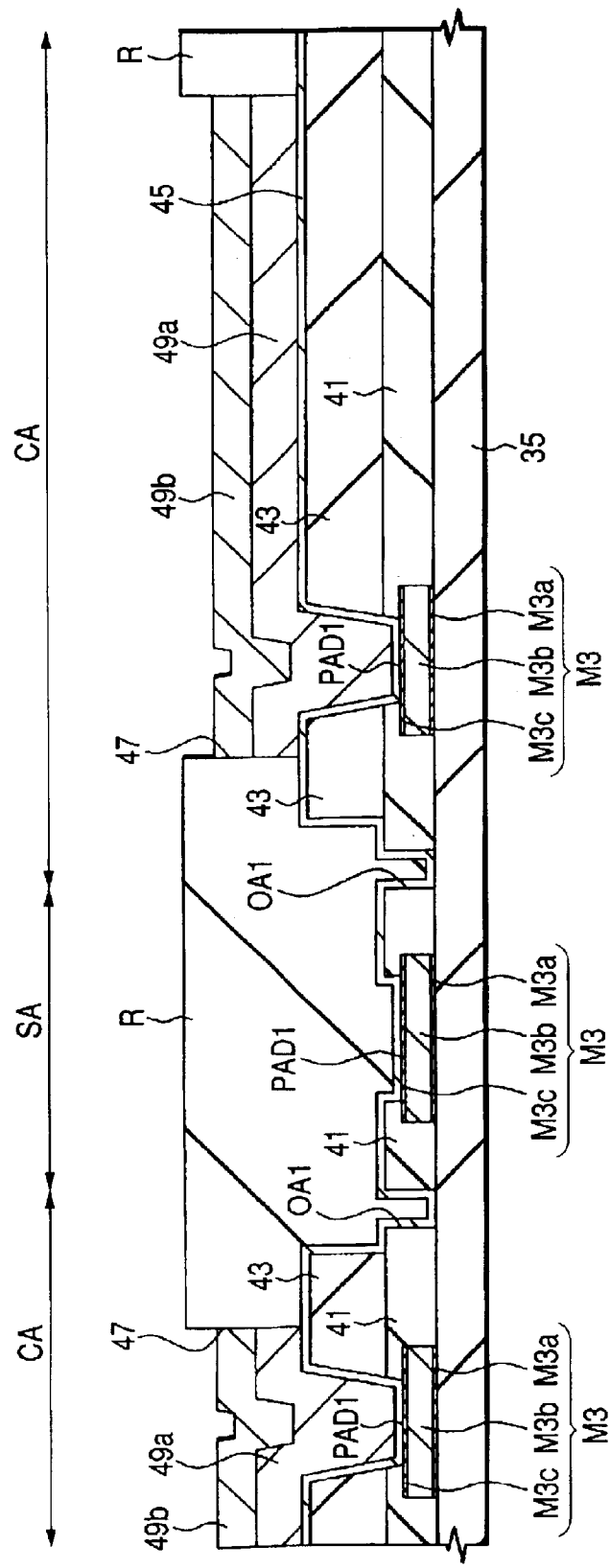

METHOD OF MANUFACTURING A SEMICONDUCTOR INTEGRATED CIRCUIT DEVICE

BACKGROUND OF THE INVENTION

The present invention relates to a semiconductor device and a manufacturing technology thereof. More particularly, it relates to a technology effectively applicable to a semiconductor device having a metal formed by a plating method under a bump electrode, and a manufacturing method thereof.

As compared with wire bonding for establishing an electrical connection between the bonding pad portion on the surface of an IC (Integrated Circuit) chip and the lead of a package by a thin gold wire or the like, wireless bonding has been more developed for commercial use as a package enabling reductions in size and thickness.

The wireless bonding denotes a mounting style for establishing a connection with a bump formed on a bonding pad portion of an IC chip without using a bonding wire such as a thin gold wire when the IC chip is mounted on a printed board, or the like.

In particular, the CSP (chip size package) is the generic name of a package equal in size to or slightly larger than the semiconductor chip. With the CSP, (1) higher pin count becomes easier to achieve; and (2) a wide space between bump electrodes can be allowed, and further, the diameter of each bump electrode can be increased. For the reasons (1) and (2), and the like, the CSPs include the package in which bump electrodes for constituting external connection terminals are area-arrayed at the central part of the chip (of a so-called area array structure).

For manufacturing the IC of the area array structure, for example, a wiring for establishing a connection between the pad portions arrayed along the peripheral portion of a chip and bump electrodes arrayed on the entire surface of the chip, i.e., a so-called rewiring becomes necessary.

For example, Japanese Laid-Open Patent Publication No.Hei 2000-294607 discloses the following technology: In an insulating layer 6 made of a polyimide-based resin, an opening 6A for exposing the surface of an electrode pad portion 2A is formed. On the insulating film 6 including the inside of the opening 6A, a wiring 7 composed of, for example, a copper (Cu) film is formed. Further, on the wiring 7, an insulating layer 8 is formed. An opening 8B for exposing the one end side of the wiring 7 is formed in the insulating layer 8. Then, on the opening 8B, an electrode pad portion 9B is formed at a larger array pitch than the array pitch for the electrode pad portion 2A.

SUMMARY OF THE INVENTION

The present inventors have been involved in the study and development of a semiconductor integrated circuit device (semiconductor device), and examining the use of a rewiring for establishing a connection between an electrode pad portion and a bump electrode. Further, on the rewiring, a bump electrode is formed, and an Au (gold) film or the like is being examined as its underlying film. Adoption of an economical plating method has been under study as a forming method thereof.

On the other hand, on a wafer, a pattern for test (TEG: Test Element Group) formed by the same process as that for elements or wirings constituting an actual semiconductor integrated circuit is formed in order to appropriately test the basic characteristics of a semiconductor integrated circuit, for example, the connection resistance of a wiring or a plug, the temperature characteristics thereof, and the like.

Such a TEG is formed between chip areas on each of which an actual semiconductor integrated circuit is formed, i.e., on a so-called scribe line.

However, onto the pad portions of the TEG, a rewiring or a bump electrode is not required to be formed. Whereas, when a rewiring, a protective layer thereon, and the like are formed, the multilayer film thickness on the scribe line increases, so that dicing (cutting into individual pieces) becomes difficult.

Therefore, as described in detail later, when the underlying film or the like is formed, the pad portion as the top of the TEG is in the exposed state. Therefore, the pad portion is corroded by a plating solution or a cleaning solution prior to plating.

Further, for a semiconductor integrated circuit, in addition to the test using the TEG, another test is also performed on the characteristics of an actual semiconductor integrated circuit. For example, in an electrically writable and erasable non-volatile memory (EEPROM: Electrically Erasable Programmable Read Only Memory) such as a flash memory, for example, the flash memory is exposed to (subjected to burn-in) under high temperature, for example, under a 250° C. atmosphere for about 8 hours to determine the characteristics of the memory cell prior and subsequent thereto, for example, the change in amount of charges stored in a floating electrode. Thus, a good/bad evaluation thereof is performed.

At this step, on the surface of the pad portion to be used for the test, the foregoing gold (Au) layer is formed as the underlying film for the purposes of 1) reducing the contact resistance of a probe abutting against the top of the pad portion; and further 2) improving the wettability of the solder bump formed on the pad portion after the test.

However, upon application of a heat load due to burn-in to the Au layer, as described in detail later, deterioration in wettability for solder mounting, or deterioration in shear strength after solder bump formation occurred.

It is therefore an object of the present invention to enable a proper evaluation of a semiconductor integrated circuit device by preventing the corrosion of the pad portions on a TEG.

Further, it is another object of the present invention to prevent the exposure of the pad portion on TEG, and thereby to prevent poor plating in a chip area on which an actual device is formed, and in addition, to improve the characteristics of a semiconductor integrated circuit device.

Still further, it is a still other object of the present invention to improve the wettability upon solder mounting or the shear strength after solder mounting, and thereby to improve the characteristics of a semiconductor integrated circuit device.

The above objects and novel features of the present invention will be apparent from the following description in this specification and the accompanying drawings.

Out of the aspects of the prevent invention disclosed in this application, the general outlines of typical ones will be briefly described as follows.

(1) A method of manufacturing a semiconductor integrated circuit device of the present invention, includes the steps of: forming a first wiring having a first conductive film and a second conductive film thereon in a chip area of a semiconductor wafer, and forming a pattern for test having the same configuration as that of the first wiring in a scribe area thereof; forming a second wiring on the first wiring via an insulating film; and then cleaning a pad area as the top of the second wiring with the second conductive film as the surface of the pattern for test being exposed, alternatively, forming a plated film on a pad area as the top of the second wiring with the second conductive film as the surface of the pattern for test being exposed.

(2) A semiconductor integrated circuit device of the present invention has: (a) a first wiring having a first conductive film and a second conductive film thereon; (b) an insulating film having an opening on a first pad area which is a part of the first wiring; (c) a second wiring having a second conductive film formed on the insulating film including the inside of the opening and a third conductive film formed on the second conductive film, the second wiring establishing a connection between the first pad area and a second pad area; and (d) a bump electrode formed on the second pad area as the top of the second wiring. Further, a pattern for test having the same configuration as that of the first wiring is formed on a scribe area of a semiconductor wafer. The second wiring and a plated film are not formed on the pattern for test.

(3) A method of manufacturing a semiconductor integrated circuit device of the present invention, includes the steps of: forming a first conductive film on a pad area of a first wiring electrically connected to a semiconductor element formed on a semiconductor wafer; subjecting the semiconductor wafer to a heat treatment, and testing the characteristics of the semiconductor element by utilizing the pad area; and then further forming a second conductive film on the first conductive film.

(4) A method of manufacturing a semiconductor integrated circuit device of the present invention, includes the steps of: forming a polyimide film having an opening on a pad area as the top of a wiring electrically connected to a non-volatile memory formed on a semiconductor substrate in wafer form; and then applying a heat load to the semiconductor substrate in wafer form for a given time period, and testing the information retention characteristics of the non-volatile memory by utilizing the pad area.

(5) A method of manufacturing a semiconductor integrated circuit device of the present invention, includes the steps of: forming a polyimide film having an opening on a pad area as the top of a wiring electrically connected to a non-volatile memory formed on a semiconductor substrate in wafer form; applying a heat load to the semiconductor substrate in wafer form for a given time period, and testing the information retention characteristics of the non-volatile memory by utilizing the pad area; and then forming a plated film on the pad area.

(6) A semiconductor integrated circuit device of the present invention, includes: a first wiring formed on a chip area of a semiconductor wafer, and a pattern for test formed on a scribe area of the semiconductor wafer, the first wiring and the pattern for test each having a first conductive film and a second conductive film thereon; a second wiring for establishing a connection between a first pad area which is a part of the first wiring and a second pad area situated in the chip area; and a plated film formed on the second pad area as the top of the second wiring, characterized in that the second wiring and the plated film are not formed on the pattern for test.

(7) A semiconductor integrated circuit device of the present invention, includes: a first wiring having a first conductive film and a second conductive film thereon; an insulating film having an opening on a first pad area which is a part of the first wiring; and a second wiring having a third conductive film formed on the insulating film including the inside of the opening, and a fourth conductive film formed on the third conductive film, the second wiring establishing a connection between the first pad area and a second pad area which is a part of the second wiring; and a bump electrode formed on the second pad area.

(8) The semiconductor integrated circuit device according to the item (7) is characterized in that the first conductive film contains Al (aluminum) or Cu (copper) as a main component.

(9) The semiconductor integrated circuit device according to the item (7) is characterized in that the second conductive film is composed of a single layer film of a TiN (titanium nitride) film, a Ta (tantalum) film, a TaN (tantalum nitride) film, a W (tungsten) film or a WN (tungsten nitride) film, or a multilayer film of these films.

(10) The semiconductor integrated circuit device according to the item (7) is characterized in that the third conductive film is a Cr film or a multilayer film having a Cr (chromium) film.

(11) The semiconductor integrated circuit device according to the item (7) is characterized in that the fourth conductive film is a multilayer film of a Cu (copper) film and a Ni (nickel) film.

(12) The semiconductor integrated circuit device according to the item (11) is characterized in that the bump electrode is composed of a solder formed on an Au (gold) film formed on the Ni (nickel) film, and the Au film is formed by a plating method.

BRIEF DESCRIPTION OF THE DRAWINGS

FIG. 13 is a cross sectional view of the essential part of the substrate, for showing a manufacturing process of the semiconductor integrated circuit device which is Embodiment 1 of the present invention;

FIG. 14 is a cross sectional view of the essential part of the substrate, for showing a manufacturing process of the semiconductor integrated circuit device which is Embodiment 1 of the present invention;

FIG. 15 is a cross sectional view of the essential part of the substrate, for showing a manufacturing process of the semiconductor integrated circuit device which is Embodiment 1 of the present invention;

FIG. 16 is a cross sectional view of the essential part of the substrate, for showing a manufacturing process of the semiconductor integrated circuit device which is Embodiment 1 of the present invention;

FIG. 17 is a cross sectional view of the essential part of the substrate, for showing a manufacturing process of the semiconductor integrated circuit device which is Embodiment 1 of the present invention;

FIG. 18 is a cross sectional view of the essential part of the substrate, for showing a manufacturing process of the semiconductor integrated circuit device which is Embodiment 1 of the present invention;

FIG. 19 is a cross sectional view of the essential part of the substrate, for showing a manufacturing process of the semiconductor integrated circuit device which is Embodiment 1 of the present invention;

DETAILED DESCRIPTION OF THE PREFERRED EMBODIMENTS

Figure 1:
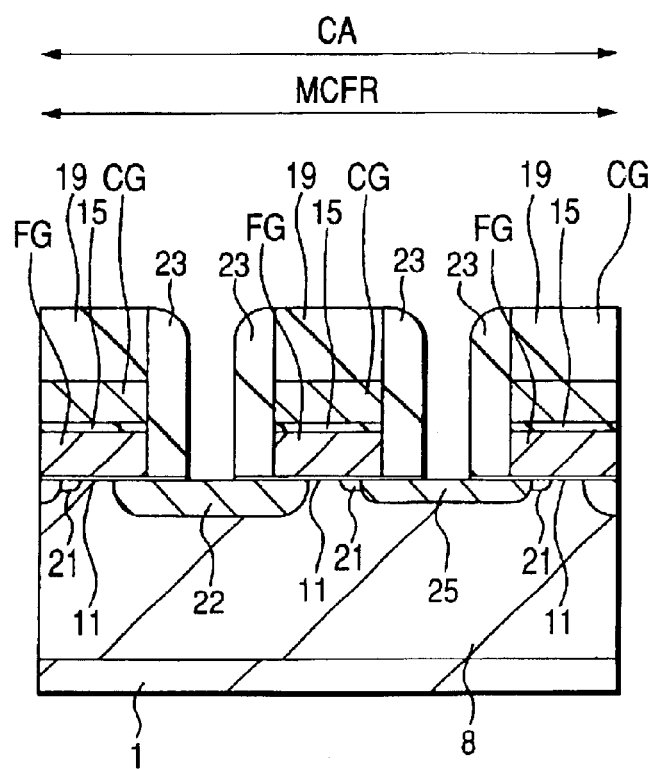
FIG. 1 is a cross sectional view of the essential part of a substrate, for showing a manufacturing process of a semiconductor integrated circuit device which is Embodiment 1 of the present invention.

Below, the present invention will be described by way of embodiments with reference to the accompanying drawings. Incidentally, throughout the drawings for describing the embodiments, the elements having the same function are represented by the same reference numerals and characters, and the repeated description thereon is omitted.

Embodiment 1

A semiconductor integrated circuit device which is an embodiment of the present invention will be described in accordance with a manufacturing method thereof.

(1) First, with reference to FIGS. 1 to 6, a description will be given to the steps up to the formation of a non-volatile semiconductor memory cell (below, simply referred to as a "memory cell") on a memory cell formation region (MCFR) of a semiconductor wafer, and an n-channel type MISFET Qn on a peripheral circuit formation region thereof. Incidentally, FIGS. 1 to 6 are cross sectional views of the essential parts or plan views of the essential parts of a substrate, for showing a manufacturing method of a semiconductor integrated circuit device (non-volatile semiconductor memory) which is Embodiment 1 of the present invention.

Figure 2:
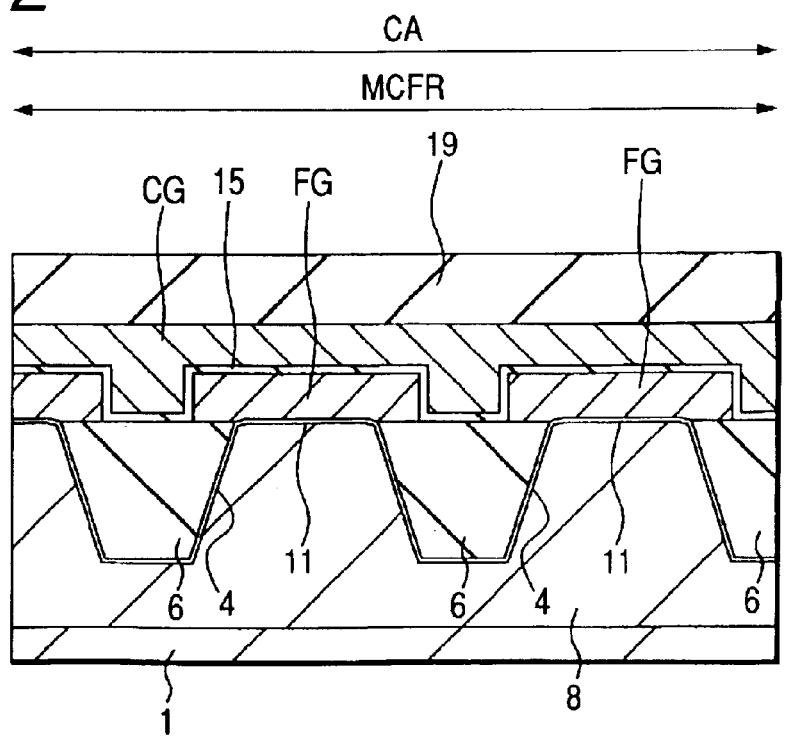
FIG. 2 is a cross sectional view of the essential part of the substrate, for showing a manufacturing process of the semiconductor integrated circuit device which is Embodiment 1 of the present invention.
Figure 3:
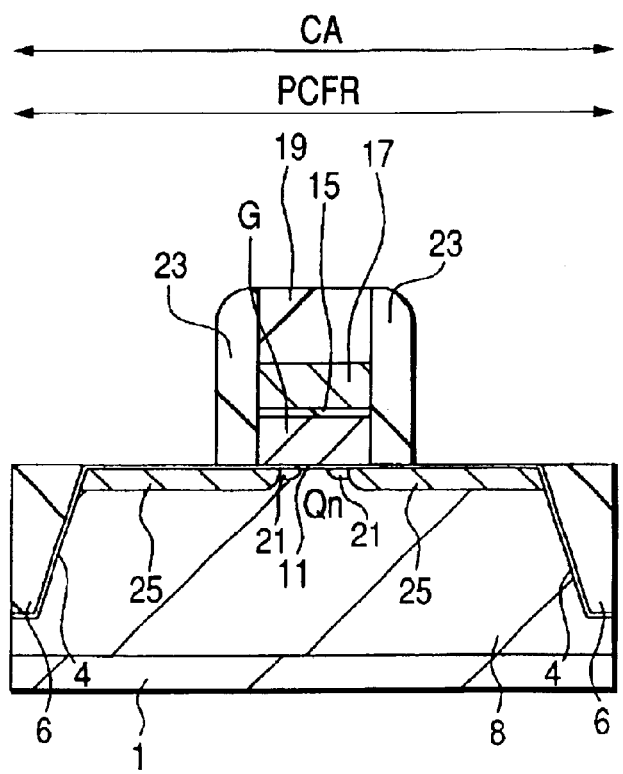
FIG. 3 is a cross sectional view of the essential part of the substrate, for showing a manufacturing process of the semiconductor integrated circuit device which is Embodiment 1 of the present invention.
Figure 4:
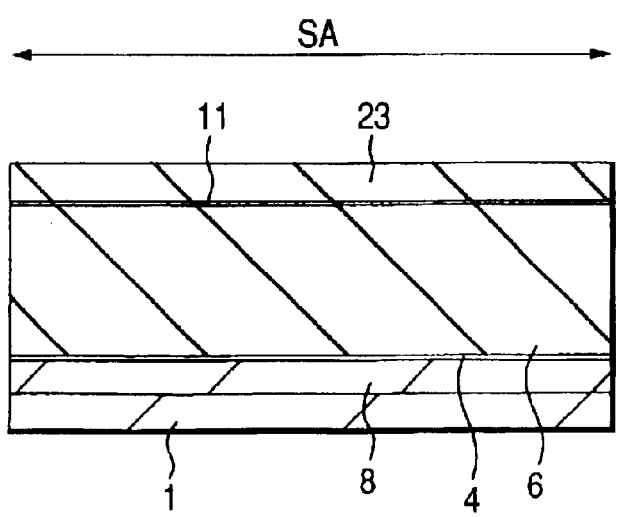
FIG. 4 is a cross sectional view of the essential part of the substrate, for showing a manufacturing process of the semiconductor integrated circuit device which is Embodiment 1 of the present invention.
Figure 5:
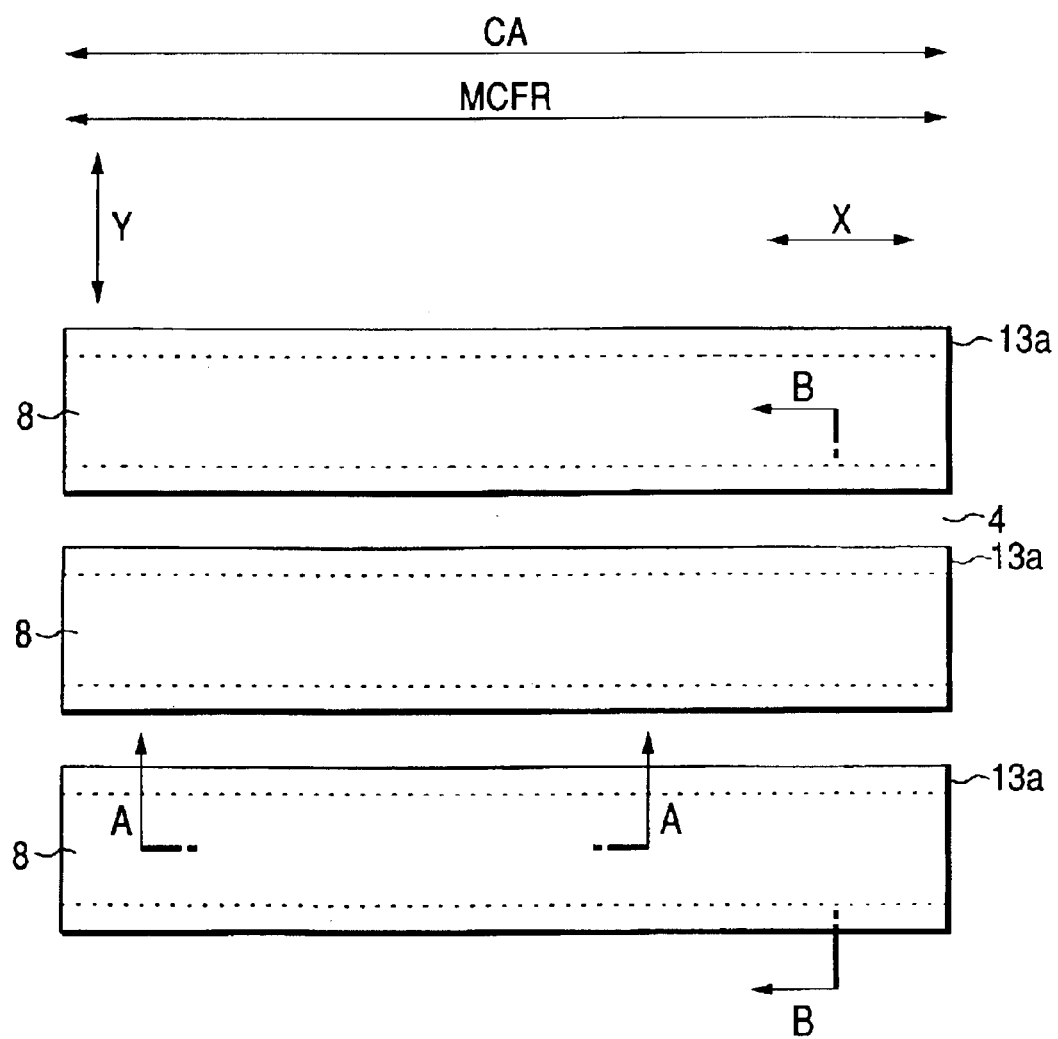
FIG. 5 is a plan view of the essential part of the substrate, for showing a manufacturing process of the semiconductor integrated circuit device which is Embodiment 1 of the present invention.

FIGS. 1 to 3 are cross sectional views of the essential part of a chip area CA of a semiconductor wafer (semiconductor substrate 1). FIG. 4 is a cross sectional view of the essential part of a scribe area SA of the semiconductor wafer. Further, FIGS. 1 and 2 show the cross sectional views of the essential part of the memory cell formation region (MCFR) of the chip area CA. FIG. 3 shows a cross sectional view of the essential part of a peripheral circuit formation region (PCFR) of the chip area CA. FIG. 5 is a plan view of the essential part of the substrate of the memory cell formation region (MCFR). FIG. 1 corresponds to the cross section taken along line A—A of FIG. 5, and FIG. 2 corresponds to the cross section taken along line B—B of FIG. 5.

Figure 34:
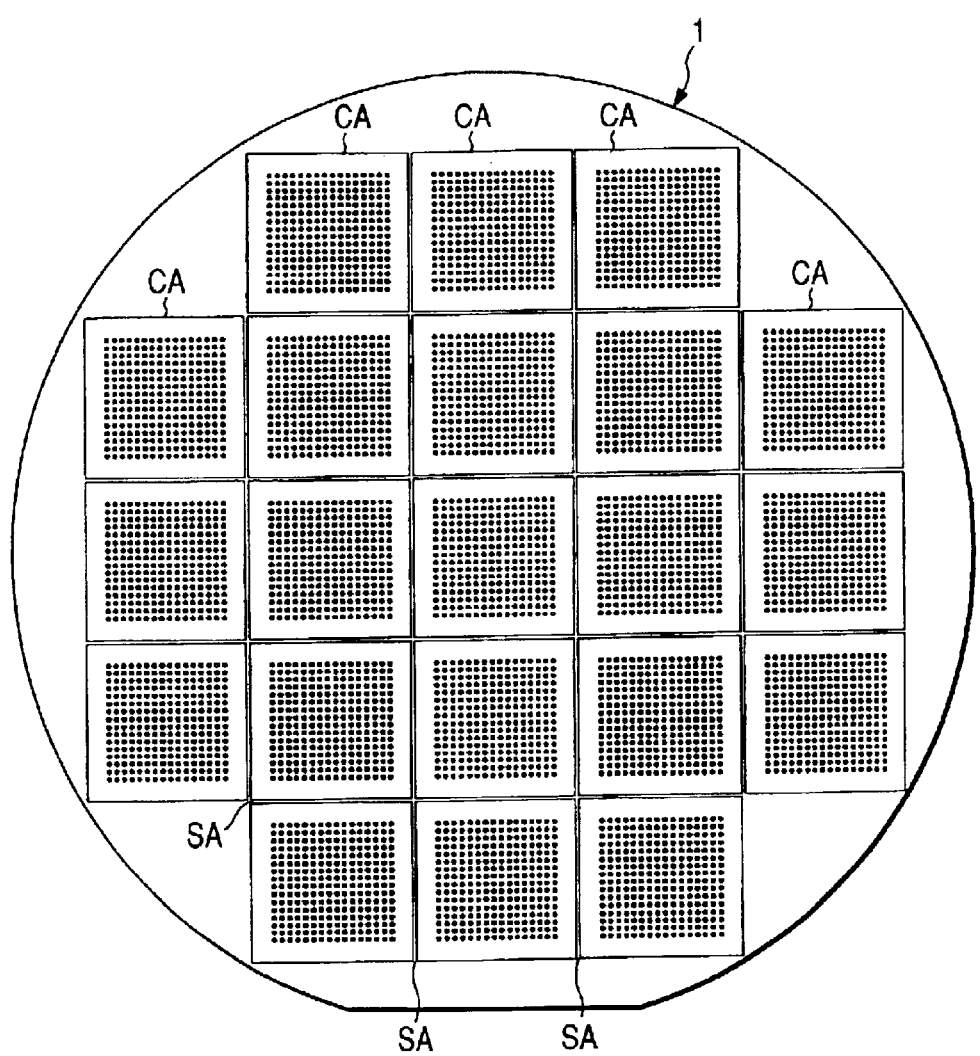
FIG. 34 is an overall plan view of a semiconductor wafer after the formation of bump electrodes of the semiconductor integrated circuit device which is Embodiment 1 of the present invention.

Namely, as shown in FIG. 34, the semiconductor wafer (semiconductor substrate) 1 on which the semiconductor integrated circuit device of this embodiment will be formed has a plurality of generally rectangular chip areas CAs. A plurality of the chip areas CAs are partitioned by a scribe area SA. As described later, the semiconductor wafer 1 is divided into individual chips by cutting along the scribe area SA.

As shown in FIGS. 1 to 5, element isolation areas 4 are formed in the semiconductor substrate (below, simply referred to as a "substrate") 1 made of, for example, p-type single crystal silicon. The element isolation areas 4 are formed, for example, in the following manner.

A groove is formed by etching the substrate 1. Thereafter, the substrate 1 is thermally oxidized, thereby to form a thin silicon dioxide film on the inner wall of the groove. Further, on the substrate 1 including the inside of the groove, for example, a silicon dioxide film 6 is deposited as an insulating film by a CVD (Chemical Vapor Deposition) method. Then, the portion of the silicon dioxide film 6 outside the grooves is polished by a CMP (Chemical Mechanical Polishing) method, thereby to embed the silicon dioxide film 6 in the grooves. As a result, the active areas in which memory cells and peripheral circuits are formed are isolated from each other. It is noted that the element isolation areas 4 may also be formed by using a LOCOS (Local Oxidation of silicon) method.

Then, p-type impurities (ex., boron) are ion-implanted into the substrate 1, and then the substrate 1 is subjected to a heat treatment to diffuse the impurities. As a result, a p-type well 8 is formed in a memory cell formation region (MCFR) and a peripheral circuit formation region (PCFR). Incidentally, in the peripheral circuit formation region (PCFR), an n-type well is formed, if required. However, it is not shown here.

Then, the substrate 1 (p-type impurities) is (are) thermally oxidized, thereby to form a gate insulating film 11 on the surface of the p-type well 8. Incidentally, the gate insulating film 11 serves as gate insulating films of MISFETs (Metal Insulator Semiconductor Field Effect Transistors) constituting the memory cell and the peripheral circuit. However, when the films are different in thickness from each other, they are respectively formed by different steps.

Then, on the substrate 1, a phosphorus-doped polycrystal silicon film is deposited as a conductive film by, for example, a CVD method. Then, by using a photoresist film (not shown, below, simply referred to as a "resist film") as a mask, the polycrystal silicon film is dry etched. As a result, as shown in FIG. 5, a polycrystal silicon pattern 13a extending in the X direction is formed in the memory cell formation region (MCFR). FIG. 5 is a plan view of the essential part of the substrate of the memory cell formation region (MCFR) after formation of the polycrystal silicon pattern 13a. Further, a gate electrode G is formed in the peripheral circuit formation region (PCFR). Incidentally, the polycrystal silicon pattern 13a is then etched in the Y direction, resulting in a floating electrode FG of the memory cell (see FIG. 6).

Then, on the polycrystal silicon pattern 13a and the gate electrode G, for example, an ONO film 15 is formed as an insulating film. The ONO film 15 is a multilayer film of a silicon dioxide film, a silicon nitride film, and a silicon dioxide film. It is formed by sequentially depositing these films by, for example, a CVD method. Incidentally, another silicon nitride film may also be further deposited on the silicon dioxide film as the uppermost layer.

Then, on the substrate 1, a phosphorus-doped polycrystal silicon film 17 is deposited as a conductive film by, for example, a CVD method. Incidentally, the polycrystal silicon film 17 serves as a control electrode CG of the memory cell. Subsequently, a silicon nitride film 19 is deposited thereon as an insulating film by, for example, a CVD method.

Then, by using a resist film (not shown) of the memory cell formation region (MCFR) as a mask, the silicon nitride film 19, the polycrystal silicon film 17, the ONO film 15, and the polycrystal silicon pattern 13a are dry etched.

Figure 6:
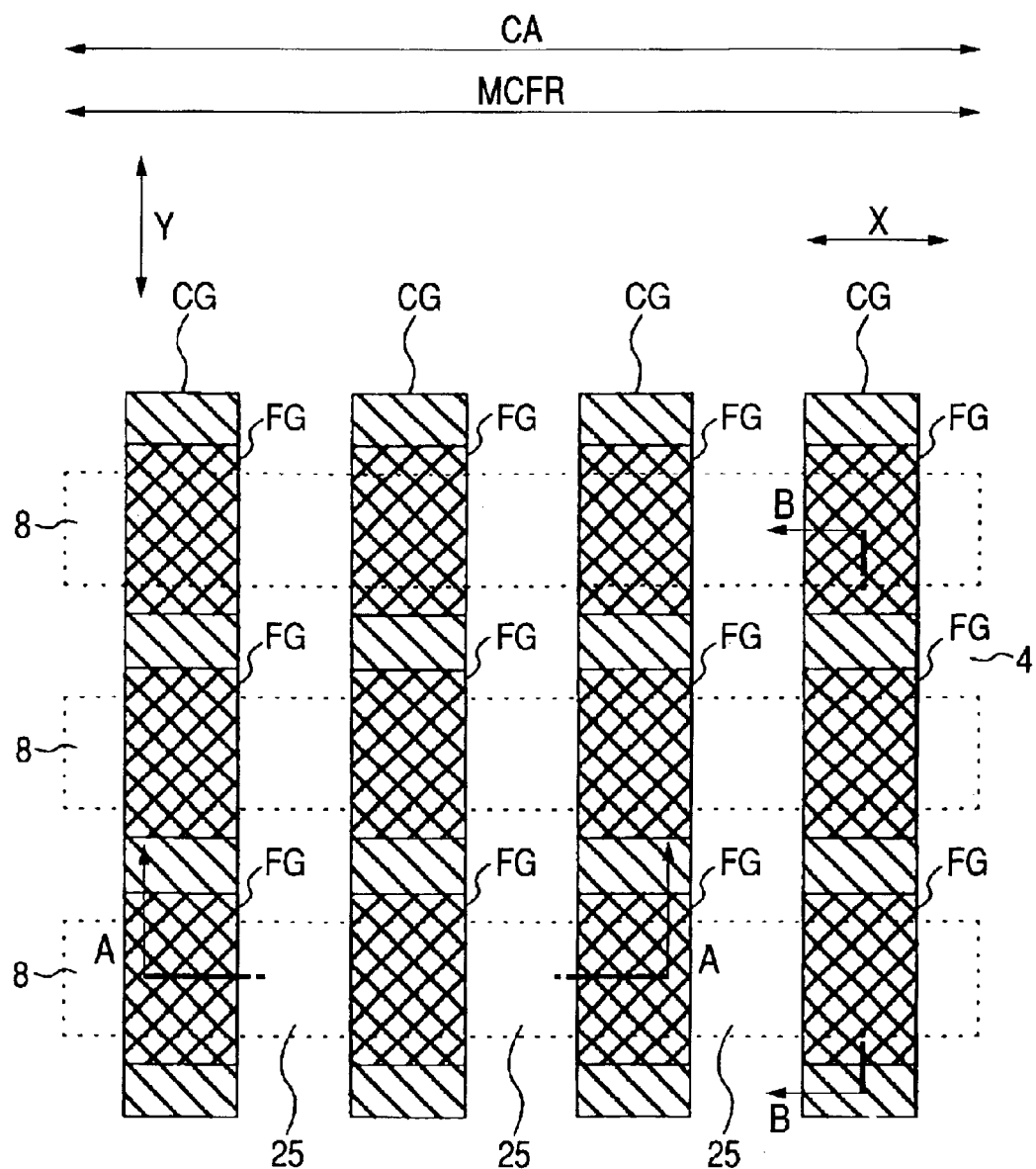
FIG. 6 is a plan view of the essential part of the substrate, for showing a manufacturing process of the semiconductor integrated circuit device which is Embodiment 1 of the present invention.

By the dry etching process, the polycrystal silicon pattern 13a is divided among the memory cells, resulting in floating electrodes FGs. Further, on each of the floating electrodes FG, a control electrode CG is formed via the ONO film 15. The control electrode CG extends in the Y direction as shown in FIG. 6. FIG. 6 is a plan view of the essential part of the substrate of the memory cell formation region (MCFR) after the formation of the control electrode CG.

Then, n-type impurities (ex., arsenic) are ion implanted in the p-type well 8 by using a resist film not shown as a mask, and then a heat treatment is performed to diffuse the impurities. As a result, n⁻-type semiconductive regions 21 are formed on opposite sides of the gate electrode G. Further, an n⁻_type semiconductive region 21 is formed on one side of the control electrode CG.

Further, by using a resist film not shown as a mask, n-type impurities (ex., arsenic) are ion implanted into the p-type well 8. Then, a heat treatment is performed to diffuse the impurities. As a result, an n⁺-type semiconductive regions 22 (drain) is formed on the other side of the control electrode CG.

Then, on the substrate 1, a silicon nitride film is deposited as an insulating film by, for example, a CVD method, and anisotropically etched. As a result, a sidewall spacer 23 is formed on the sidewall of the control electrode CG and the gate electrode G.

Then, by using a resist film not shown as a mask, n-type impurities (ex., phosphorus or arsenic) are ion implanted into the p-type well 8. Then, a heat treatment is performed to diffuse the impurities. As a result, n⁺-type semiconductive regions 25 (source and drain regions) are formed on opposite sides of the gate electrode G. Further, an n⁺-type semiconductive region 25 (source) is formed on one side (n⁻-type semiconductive region 21) of the control electrode CG.

Through the foregoing steps, the memory cells each having the control electrode CG, the ONO film 15, the floating electrode FG, and the gate insulating film 11 are formed in the memory cell formation region (MCFR). Whereas, an n-channel type MISFET Qn is formed in the peripheral circuit formation region (PCFR). Incidentally, in this embodiment, the n-channel type MISFET formed in the peripheral circuit formation region (PCFR) was taken as an example to explain the manufacturing process thereof. However, as a matter of course, a p-channel type MISFET may also be formed in a peripheral circuit formation region (n-type well). The p-channel type MISFET can be formed by the same process as the foregoing process (for the n-channel type MISFET), except that the conductivity type of the impurity region constituting the MISFET is different. Therefore, the description on the process for forming the p-channel type MISFET is omitted.

Figure 7:
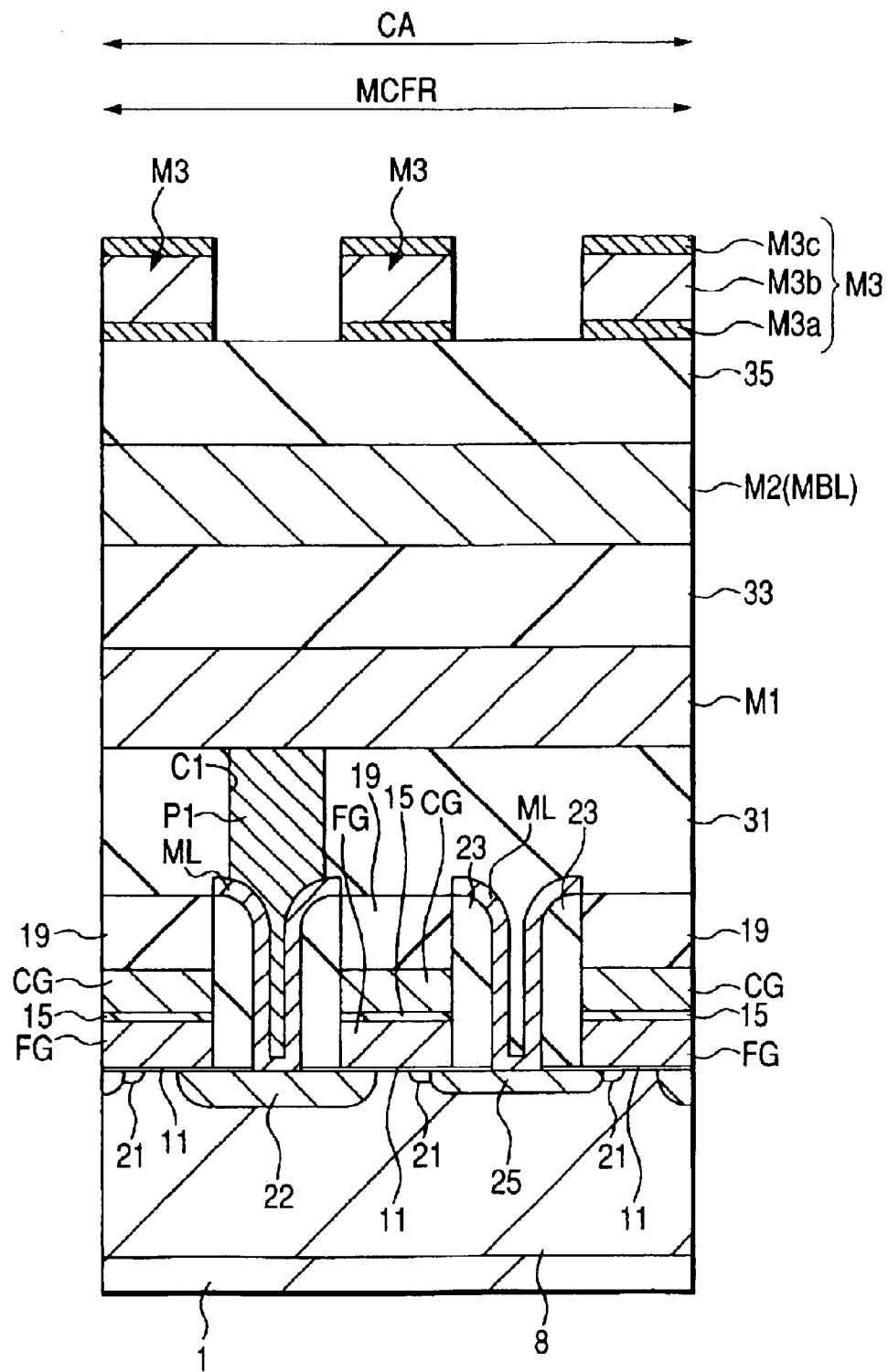
FIG. 7 is a cross sectional view of the essential part of a substrate, for showing a manufacturing process of the semiconductor integrated circuit device which is Embodiment 1 of the present invention.
Figure 8:
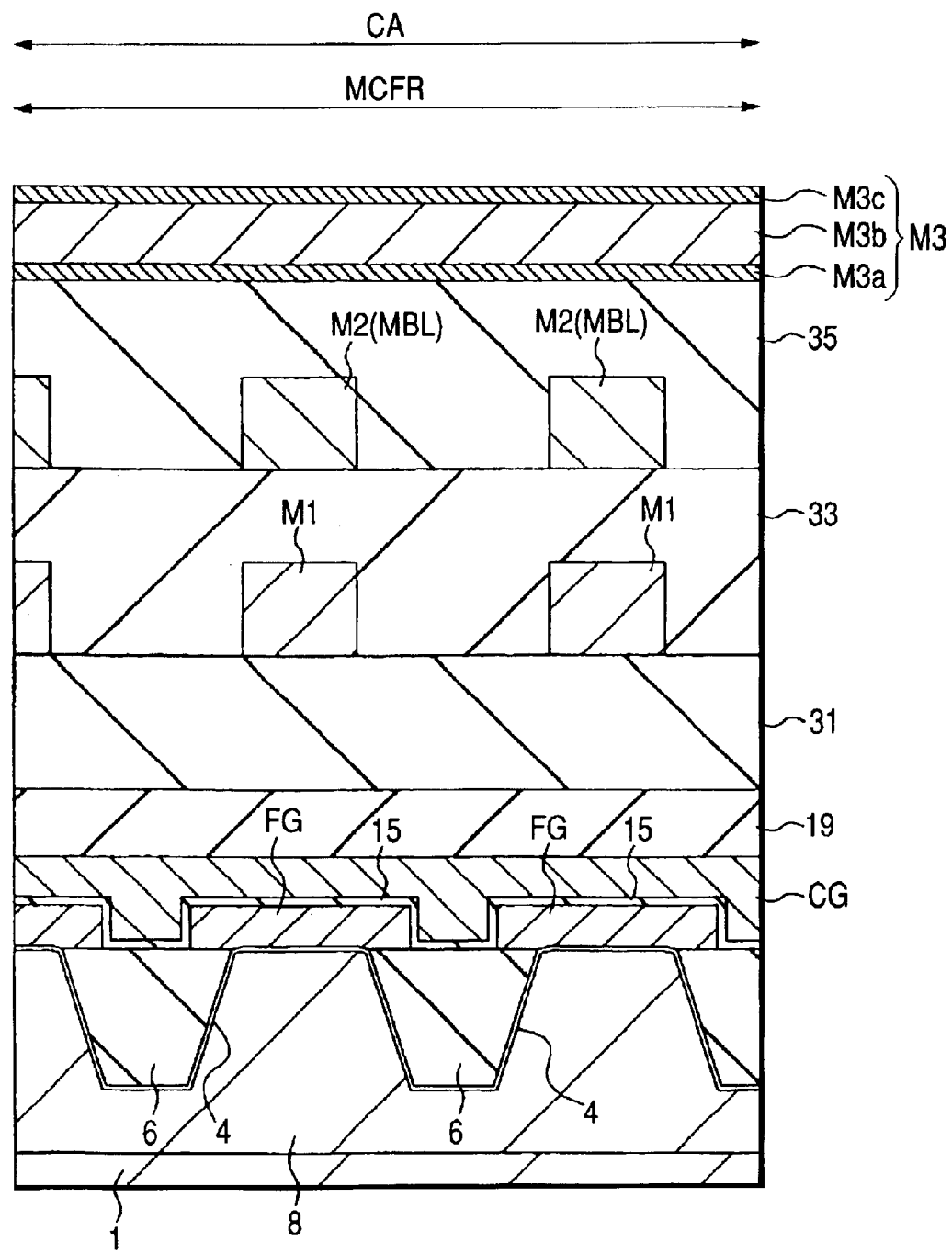
FIG. 8 is a cross sectional view of the essential part of the substrate, for showing a manufacturing process of the semiconductor integrated circuit device which is Embodiment 1 of the present invention.
Figure 9:
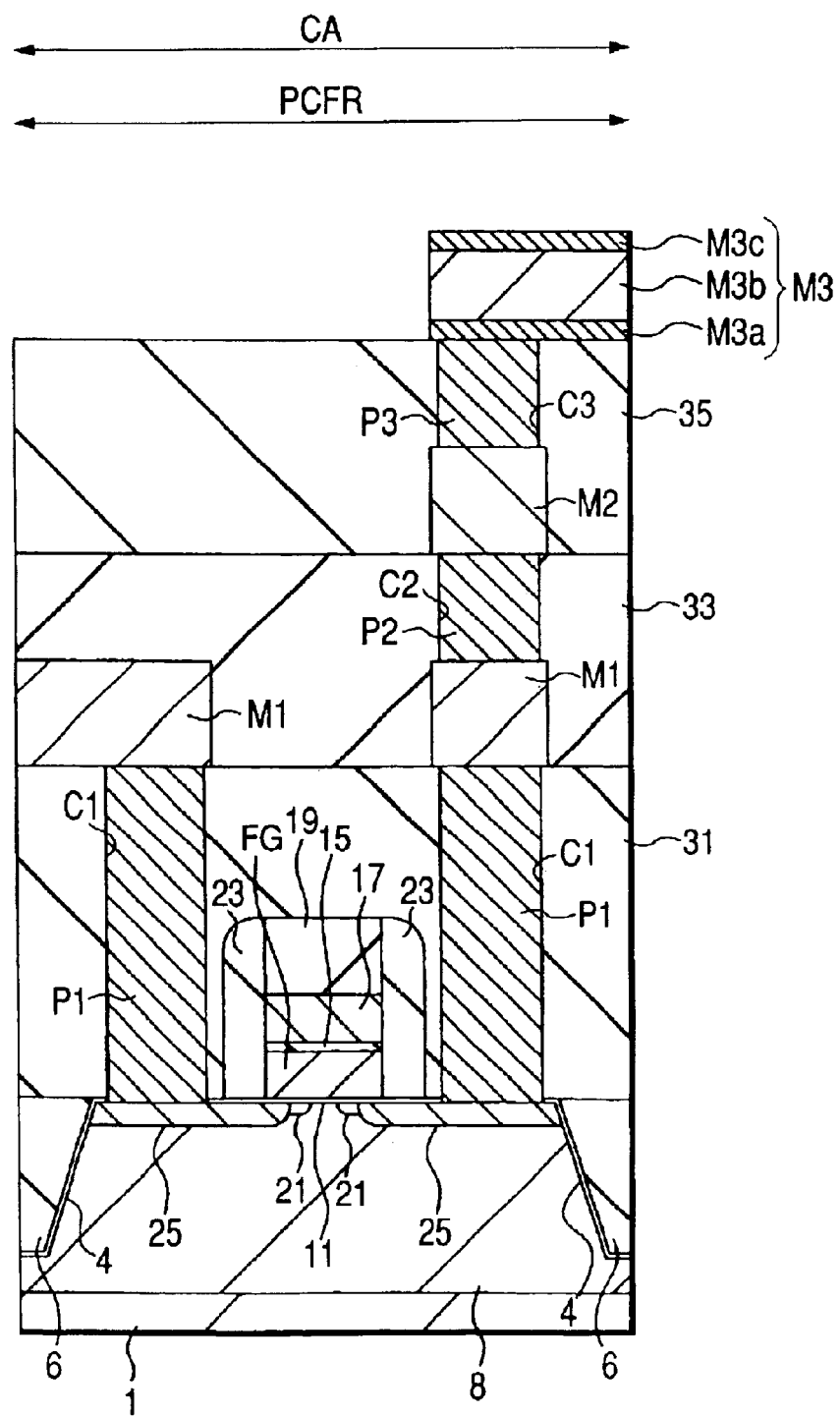
FIG. 9 is a cross sectional view of the essential part of the substrate, for showing a manufacturing process of the semiconductor integrated circuit device which is Embodiment 1 of the present invention.
Figure 10:
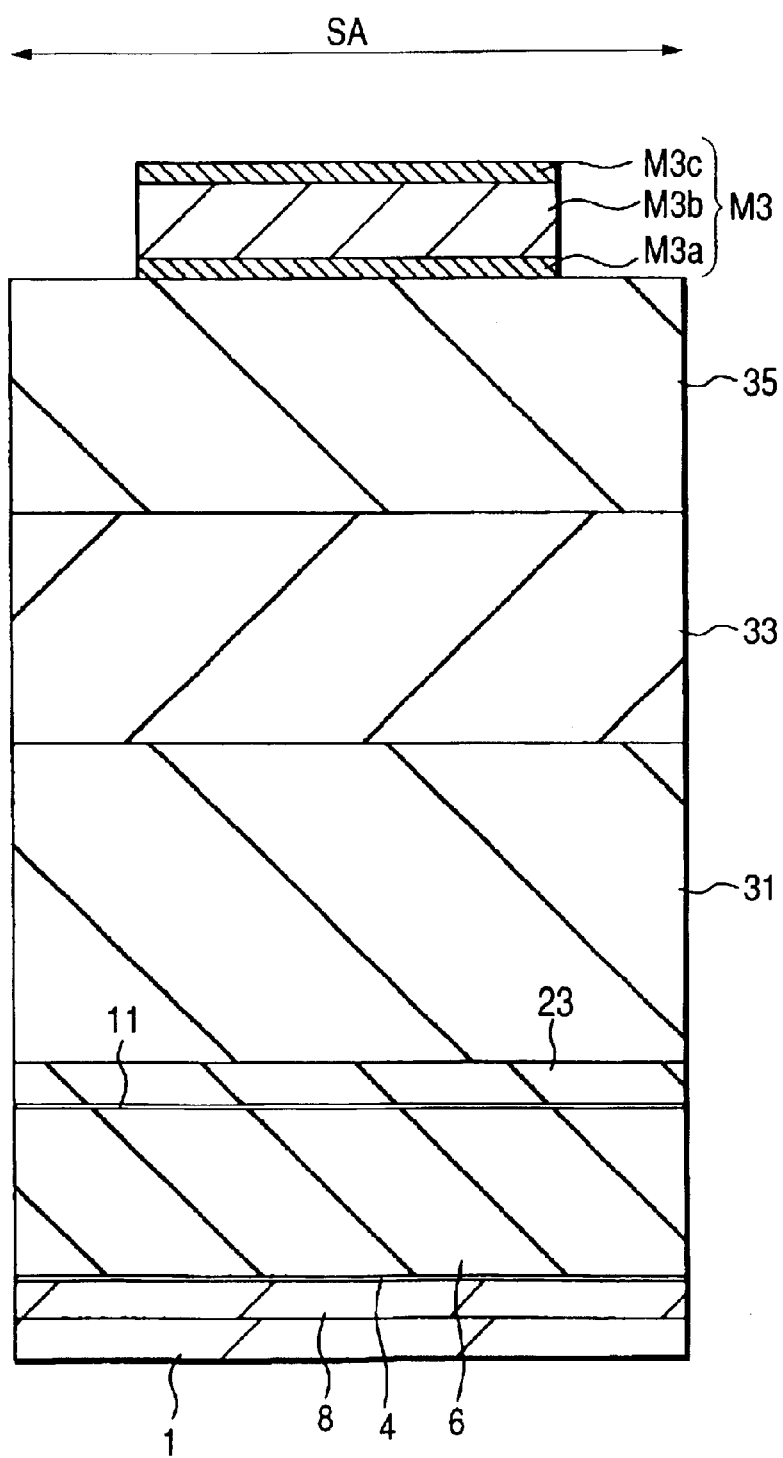
FIG. 10 is a cross sectional view of the essential part of the substrate, for showing a manufacturing process of the semiconductor integrated circuit device which is Embodiment 1 of the present invention.
Figure 11:
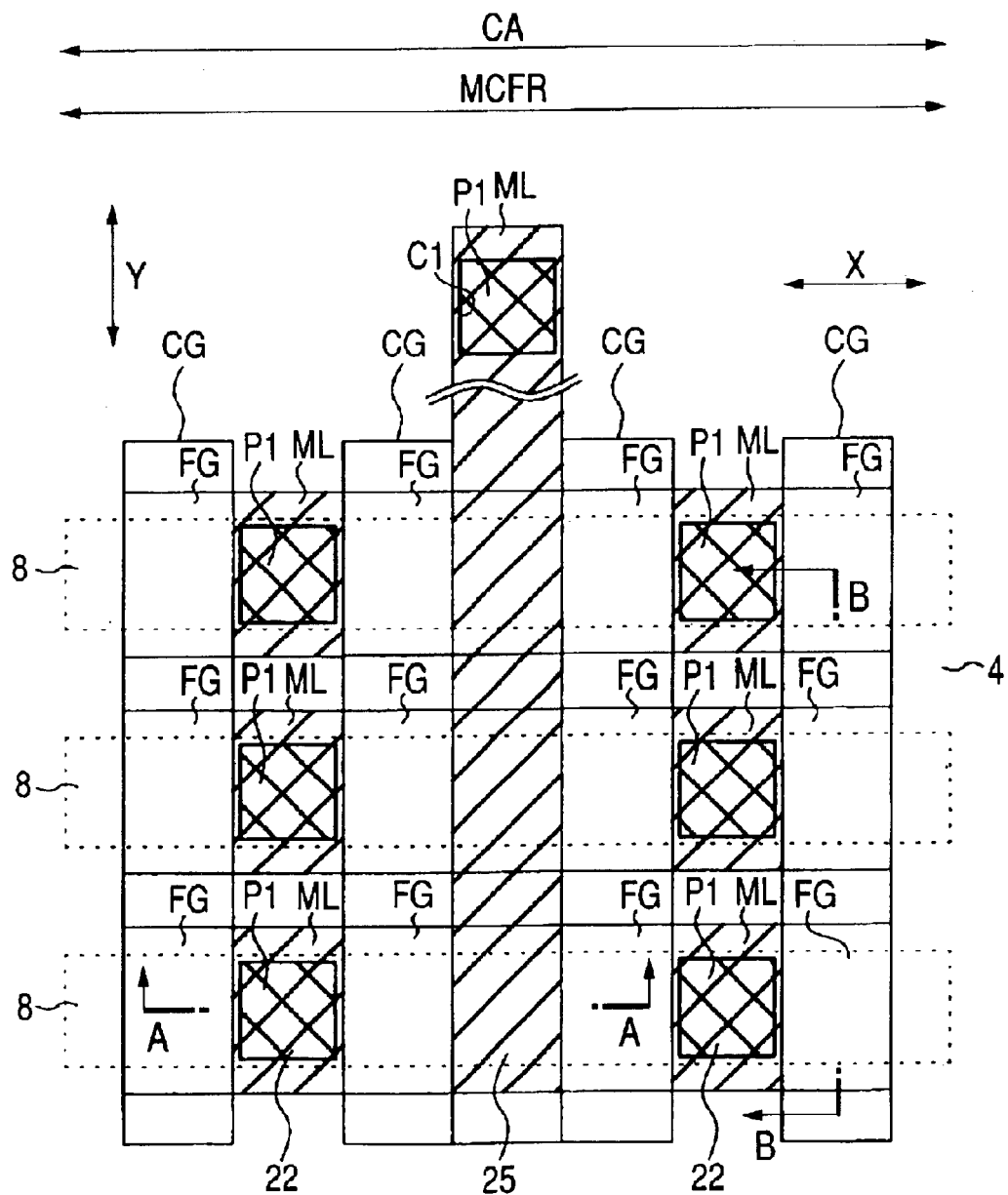
FIG. 11 is a plan view of the essential part of the substrate, for showing a manufacturing process of the semiconductor integrated circuit device which is Embodiment 1 of the present invention.
Figure 12:
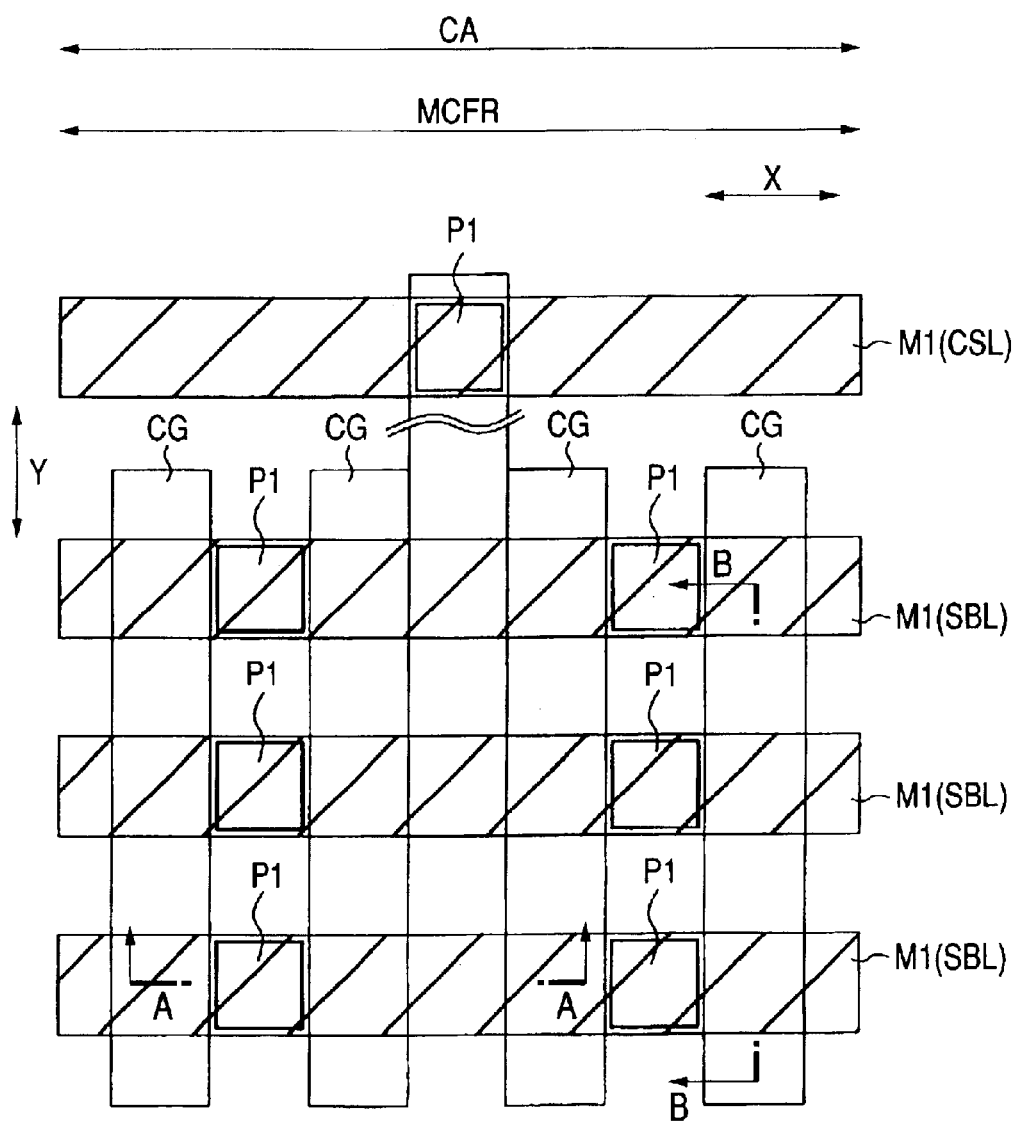
FIG. 12 is a plan view of the essential part of the substrate, for showing a manufacturing process of the semiconductor integrated circuit device which is Embodiment 1 of the present invention.

(2) Then, a description will be given to a step of forming, for example, a three-layered wiring on the memory cell and the n-channel type MISFET Qn by reference to FIGS. 7 to 12. Incidentally, FIGS. 7 to 12 are cross sectional views of the essential part or plan views of the essential part of the substrate, for showing a method of manufacturing a semiconductor integrated circuit device (non-volatile semiconductor memory) which is Embodiment 1 of the present invention. FIGS. 7 to 9 are cross sectional views of the essential part of a chip area CA of the semiconductor wafer (semiconductor substrate 1). FIG. 10 is a cross sectional view of the essential part of the scribe area SA of the semiconductor wafer. Further, FIGS. 7 and 8 are cross sectional views of the essential part of the memory cell formation region (MCFR) out of the chip area CA. FIG. 9 is a cross sectional view of the essential part of the peripheral circuit formation region (PCFR) out of the chip area CA. FIGS. 11 and 12 are cross sectional views of the essential part of the substrate of the memory cell formation region (MCFR). FIG. 7 corresponds to the cross sectional portion taken along line A—A, and FIG. 8 corresponds to the cross sectional portion taken along line B-B.

First, as shown in FIGS. 7 to 11, on the substrate 1, a W (tungsten) film is deposited as a conductive film by, for example, a CVD method. Then, by using a resist film (not shown) as a mask, the W film is dry etched, thereby to form a conductive layer ML on the n⁺-type semiconductive region 22 (drain) and the n⁺-type semiconductive region 25 (source) in the memory cell formation region (MCFR). Incidentally, the conductive layer ML is formed in a divided manner among the memory cells on the n⁺-type semiconductive region 22 as shown in FIG. 11. Whereas, it is formed in such a manner as to connect the sources of the memory cells situated along the Y direction on the n⁺-type semiconductive regions 25 (sources).

Then, on the conductive layer ML and the silicon nitride film 19, a silicon dioxide film 31 is deposited as an insulating film by, for example, a CVD method. Then, the portion of the silicon dioxide film 31 on the conductive layer ML is removed, thereby to form a contact hole C1. In this step, other contact holes C1 are also formed on the n⁺-type semiconductive regions 25 (source and drain regions) of the peripheral circuit formation region (PCFR). Incidentally, as shown in FIG. 11, the contact hole C1 on the n⁺-type semiconductive regions 25 (source) of the memory cell formation region (MCFR) occurs on a different cross section from that of FIG. 7.

Then, on the silicon dioxide film 31 including the inside of the contact hole C1, a multilayer film (not shown) of Ti (titanium) and TiN (titanium nitride) is formed as a barrier film by, for example, a sputtering method. Subsequently, a W (tungsten) film is further deposited as a conductive film thereon by, for example, a CVD method. Then, the portions of the W film, the TiN film, and the Ti film outside the contact hole C1 are removed by, for example, a CMP method, thereby to form a plug P1. FIG. 11 is a plan view of the essential part of the substrate of the memory cell formation region (MCFR) after the formation of the plug P1.

Then, on the silicon dioxide film 31 including on the plug P1, a W film is deposited as a conductive film by, for example, a CVD method. Subsequently, the W film is dry etched by using a resist film (not shown) as a mask, thereby to form a first layer wiring M1. The first layer wiring M1 in FIGS. 7 and 8 serves as a sub bit line SBL. Whereas, another first layer wiring M1 on the plug P1 formed on the n⁺-type semiconductive region 25 (source) of the memory cell formation region (MCFR) serves as a common source line (CSL). FIG. 12 is a plan view of the essential part of the substrate of the memory cell formation region (MCFR) after the formation of the first layer wiring M1.

Then, on the silicon dioxide film 31 including on the first layer wiring M1, a silicon dioxide film 33 is deposited as an insulating film by, for example, a CVD method. Subsequently, the portion of the silicon dioxide film 33 on the first layer wiring M1 is removed, thereby to form a contact hole C2. Then, a conductive film is embedded in the contact hole C2 as with the plug 1, thereby to form a plug P2.

Then, on the silicon dioxide film 33 including on the plug 2, a W film is deposited as a conductive film by, for example, a CVD method. Subsequently, the W film is dry etched by using a resist film (not shown) as a mask, thereby to form a second layer wiring M2. Incidentally, the second layer wiring M2 in FIGS. 7 and 8 serves as a main bit line MBL connected to the sub bit line SBL via a plug not shown. The main bit line MBL extends in the same direction (X direction) as with the sub bit line SBL.

Then, on the silicon dioxide film 33 including on the second layer wiring M2, a silicon dioxide film 35 is deposited as an insulating film by, for example, a CVD method. Subsequently, the portion of the silicon dioxide film 35 on the second layer wiring M2 is removed, thereby to form a contact hole C3. Then, a conductive film is embedded in the contact hole C3 as with the plug 1, thereby to form a plug P3.

Then, on the silicon dioxide film 35 including on the plug P3, a TiN film M3a, an Al (aluminium) alloy film M3b, and a TiN film M3c are deposited as conductive films by, for example, a sputtering method. The TiN films M3a and the M3c are formed for ensuring the reliability of the wiring, for example, in the following manner: 1) the adhesion between the Al alloy film M3b and an insulating film such as the silicon dioxide film 35 is enhanced; and 2) the electromigration resistance of the third layer wiring made of an Al alloy is improved. Incidentally, other than the TiN films, a single layer film of a Ti film, a TiW film, a Ta (tantalum) film, a W (tungsten) film, or a WN (tungsten nitride) film, or a multilayer film of these films may also be used.

Then, the TiN film M3a, the Al (aluminium) alloy film M3b, and the TiN film M3c are dry etched by using a resist film (not shown) as a mask, thereby to form a third layer wiring M3. Incidentally, the third layer wiring M3 in FIGS. 7 and 8 extends in the same direction as with the control electrode CG, and connected to the control electrode CG via a plug or a wiring not shown.

Herein, as shown in FIG. 10, the third layer wiring M3 is formed also in the scribe area SA. The third layer wiring M3 in the scribe area SA is, for example, a test pattern (TEG pattern) for evaluating the wiring resistance of the third layer wiring M3 and the temperature characteristic thereof. Whereas, although not shown, the third layer wiring M3 may be sometimes connected to other sites to be evaluated (a plug formed in the scribe area, a wiring, a memory cell, or the like).

(3) Then, on the third layer wiring M3 on the chip area CA (the memory cell formation region and the peripheral circuit formation region), and the scribe area SA, a protective film such as a passivation film or a polyimide film, a rewiring, a bump electrode, and the like are formed. A description will be given to a formation process thereof by reference to FIGS. 13 to 21, and FIGS. 24 to 33. These figures are cross sectional views or partial enlarged views of two chip areas CAs and the scribe area SA therebetween. Incidentally, layers underlying the silicon dioxide film 35 are omitted.

As described previously, in the chip area CA and the scribe area SA, the third layer wiring M3 composed of the TiN film M3a, the Al (aluminum) alloy film M3b, and the TiN film M3c is formed (see FIGS. 7 to 10, and FIG. 13). Incidentally, it makes no distinction whether the third layer wiring M3 on the chip area CA is formed in the memory cell formation region (MCFR) or in the peripheral circuit formation region (PCFR).

Then, as shown in FIG. 13, on the third layer wiring M3, a silicon nitride film and a silicon dioxide film are sequentially deposited as protective films by, for example, a CVD method to form a passivation film 41 composed of a multilayer film thereof. It is noted that the passivation film 41 may also be constituted as a single layer.

Then, each portion of the passivation film 41 at opposite sides of the scribe area SA is removed by dry etching to form an opening OA1. This distinctly defines the scribe area SA explained by reference to FIG. 34.

Then, as shown in FIG. 14, as the layer overlying the passivation film 41, a polyimide resin film 43 having openings at desired positions is formed. For forming the polyimide resin film 43, first, a photosensitive polyimide resin film is spin coated with a thickness of about 5 $\mu$m, followed by a heat treatment (pre-bake). Subsequently, the polyimide resin film is exposed to light, and developed to be perforated with openings (OA2s), followed by a heat treatment (post bake). As a result, the polyimide resin film is cured. For post bake, the heat treatment is carried out, for example, at 350° C. for about 1 hour.

Then, as shown in FIG. 15, by using the polyimide resin film 43 as a mask, the underlying passivation film 41 is dry etched to partially expose the third layer wiring M3 (TiN film M3c). Each exposed area of the third layer wiring M3 is referred to as a first pad portion PAD1. Out of the first pad portions PAD1s, the first pad portions PAD1s on the chip areas CAs are exposed through their respective openings each for establishing the connection between a rewiring described later and a bump electrode, and the first pad portions PAD1s on the scribe areas SAs are exposed through their respective openings so that, for example, a probe abuts against each such area to carry out evaluations (probe tests). The evaluations include, for example, the evaluations of the wiring resistance of the third layer wiring M3 and the temperature characteristic thereof, or the characteristics of the wirings, the plugs, or the memory cells to be connected to the third layer wiring M3, or the like (not shown). Incidentally, in this step and the subsequent steps, it is possible to carry out the evaluations properly with the first pad portions PAD1 on the scribe area SA being exposed.

Herein, it is important that the TiN film M3c at the uppermost position of the third layer wiring M3 is not removed, but left. Namely, the surface of the TiN film M3c is exposed through the first pad portion PAD1.

Then, as shown in FIG. 16, the portion of the polyimide resin film 43 on the scribe area SA is removed by dry etching. Incidentally, it is also acceptable that this step is omitted to allow the portion of the polyimide resin film 43 on the scribe area SA to remain unremoved (remain unchanged from the state shown in FIG. 15).

Then, as shown in FIG. 17, a seed layer (feed layer) 45 is formed on the polyimide resin film 43 including on the first pad portions PAD1s. The seed layer 45 is composed of a multilayer film of, for example, a Cr (chromium) film and a Cu (copper) film. It is formed in the following manner. For example, a thin Cr film with a thickness of about 75 nm is deposited on the polyimide resin film 43 by a sputtering method. Subsequently, a Cu film is deposited with a thickness of about 250 nm on the Cr film by a sputtering method.

Then, as shown in FIG. 18, a resist film R having long trenches 47 each extending from above the first pad portion PAD1 to the second pad portion PAD2 formation region is formed on the seed layer 45 by using a photolithography technology.

Then, as shown in FIG. 19, a Cu film 49a is formed in the inside of the long trench 47 by an electroplating method. The Cu film 49a is formed in the following manner. The substrate 1 is immersed in a plating solution for Cu, and the seed layer 45 is fixed at a minus (−) electrode. As a result, a Cu film 49a is deposited with a thickness of about 3.5 $\mu$m on the surface of the seed layer 45 at the bottom of the long trench 47 not covered with the resist film R.

Further, thereafter, a Ni (nickel) film 49b is formed on the Cu film 49a in the inside of the long trench 47 by an electroplating method. The Ni film 49b is formed in the following manner. The substrate 1 is immersed in a plating solution for Ni, and the seed layer 45 is fixed at a minus (−) electrode. As a result, a Ni film 49b is deposited with a thickness of about 3.3 $\mu$m on the surface of the Cu film 49a at the bottom of the long trench 47 not covered with the resist film R.

Herein, as shown in FIG. 19, the top of the scribe area SA is covered with the resist film R, so that the Cu film 49a and the Ni film 49b are not formed. This is for the following reasons. The rewiring described later is not required to be formed on the scribe area SA. Further, the reduction in thickness of the multilayer film on the scribe line as small as possible facilitates dicing.

Figure 20:
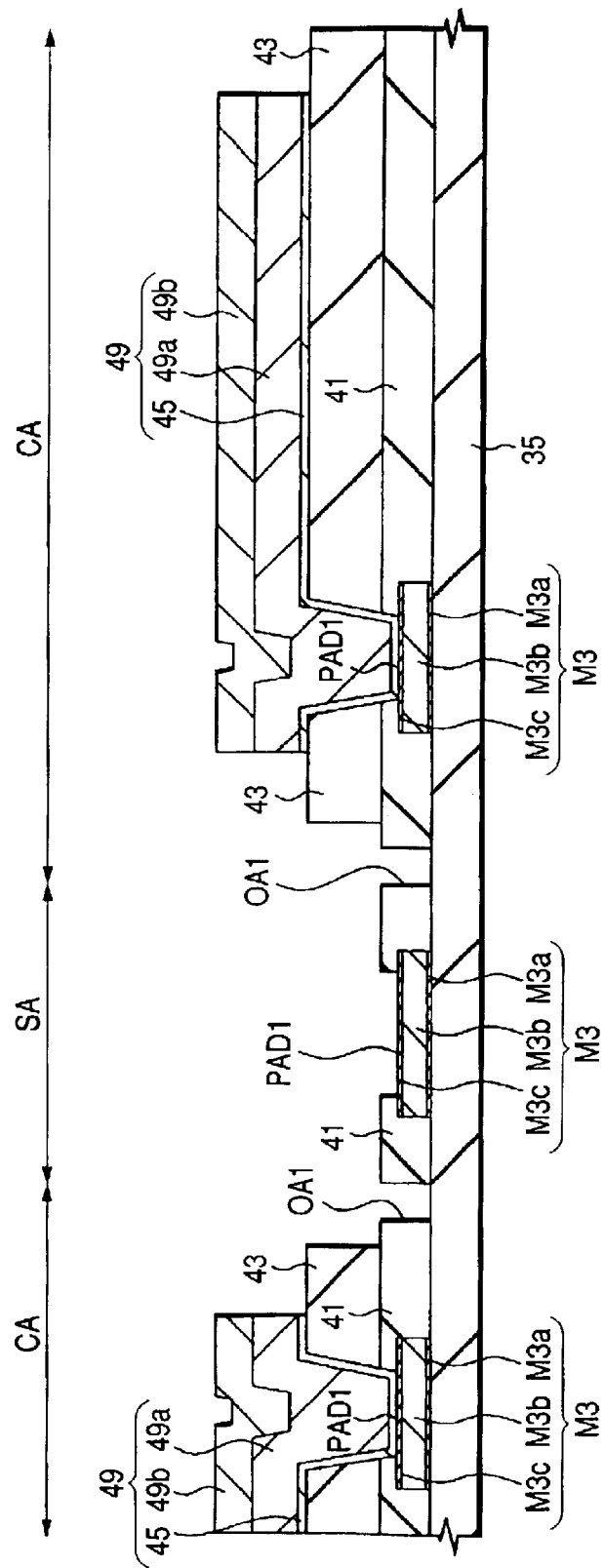
FIG. 20 is a cross sectional view of the essential part of the substrate, for showing a manufacturing process of the semiconductor integrated circuit device which is Embodiment 1 of the present invention.

Subsequently, after the resist film R has been removed, the portions of the seed layer 45 which have become unnecessary are removed by wet etching using the Cu film 49a and the Ni film 49b as a mask. As a result, a rewiring 49 composed of a multilayer film of the seed layer 45, the Cu film 49a, and the Ni film 49b is formed (FIG. 20).

The rewiring plays a role of establishing the connection between the first pad portions PAD1s and bump electrodes (second pad portions PAD2s described later) when the bump electrodes are disposed at a larger interval than the interval between the first pad portions PAD1s throughout the entire surface of the chip area CA because of the difficulty in forming the bump electrodes on the first pad portions PAD1s (see FIG. 35) densely formed along the perimeter of the chip area CA. Further, the rewiring can also be said to be the wiring for relocating the first pad portions PAD1s arranged at a narrower interval to the second pad portions PAD2s arranged at a wider interval. Alternatively, it can be said to be the wiring for changing the spacing between the pad portions.

Incidentally, the seed layer 45 at the lower part of the rewiring 49 plays a role of improving the adhesion strength between the Cu film 49a and the underlying polyimide resin film 43, or a role for preventing Cu from diffusing into the polyimide resin film 43.

Herein, the Ni film 49b is stacked on the Cu film 49a for the following reason. Namely, the formation of an undesirable product due to the contact between solder bump electrodes 49a described later and the Cu film 49a is prevented. Another reason is that the Ni film has excellent adhesion to the polyimide resin film to be formed thereafter. Incidentally, other than Ni, Cr, Ti, TiN, Ta, TaN, WN, or the like may also be used.

Figure 21:
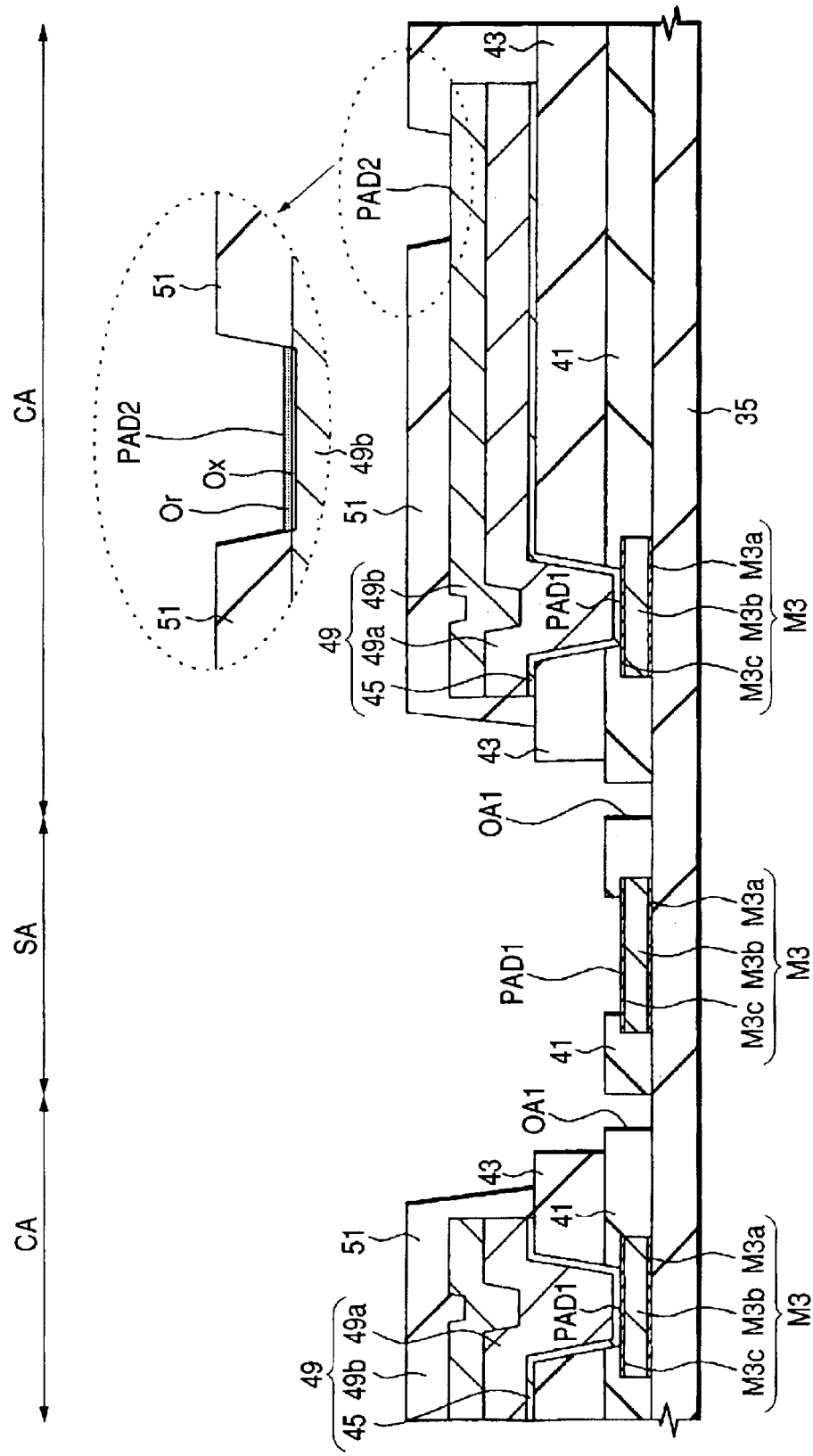
FIG. 21 is a cross sectional view of the essential part of the substrate, for showing a manufacturing process of the semiconductor integrated circuit device which is Embodiment 1 of the present invention.

Then, as shown in FIG. 21, a polyimide resin film 51 perforated with openings at the second pad portion PAD2 as the top of the rewiring 49 and the scribe area SA is formed. The polyimide resin film 51 can be formed in the same manner as with the polyimide resin film 43. Namely, a photosensitive polyimide resin film is spin coated with a thickness of about 5 $\mu$m, followed by a heat treatment (pre-bake). Subsequently, the polyimide resin film is exposed to light, and developed, to be perforated with openings to expose the second pad portion PAD2 and the scribe area SA, followed by a heat treatment (post-bake). As a result, the polyimide resin film is cured. For post bake, the heat treatment is carried out, for example, at 350° C. for about 1 hour.

Herein, the surface of the rewiring 49 (Ni film 49b) is exposed through the opening (second pad portion PAD2) of the polyimide resin film 51. Further, since the portion of the polyimide resin film 51 on the scribe area SA is removed, the surface of the third layer wiring M3 (TiN film M3c) is exposed.

Then, on the portion of the Ni film 49b exposed through the opening (the second pad portion PAD2) of the polyimide resin film 51, an Au film 53a is formed by an electroless plating method. First, an ashing processing, an alkaline cleaning processing, and processings of acid cleaning and the like are performed.

Namely, an oxide film Ox and an organic contamination layer Or of a residue of the polyimide resin film or the like are formed on the Ni film 49b of the second pad portion PAD2 (the encircled portion of FIG. 21). Therefore, first, the organic contamination layer Or is removed by an ashing processing using oxygen. However, the amount of the layer to be ashed is set to be about 0.2 $\mu$m for preventing the polyimide resin film 51 and the like from being excessively removed.

Then, alkaline cleaning and acid cleaning are carried out for removing the oxide film Ox and activating the surface of the Ni film 49b. The alkaline cleaning processing is carried out by using, for example, a sodium metasilicate solution at 60° C. for 10 minutes. Whereas, the acid cleaning is carried out by using, for example, a 20% hydrochloric acid (HCl) at 25° C. for 5 minutes.

Herein, in accordance with this embodiment, although the third layer wiring M3 in the scribe area SA is exposed, the TiN film M3 remains on the surface thereof. Therefore, it is possible to prevent the corrosion of its underlying Al alloy film M3b due to the foregoing processings such as acid cleaning.

Figure 22:
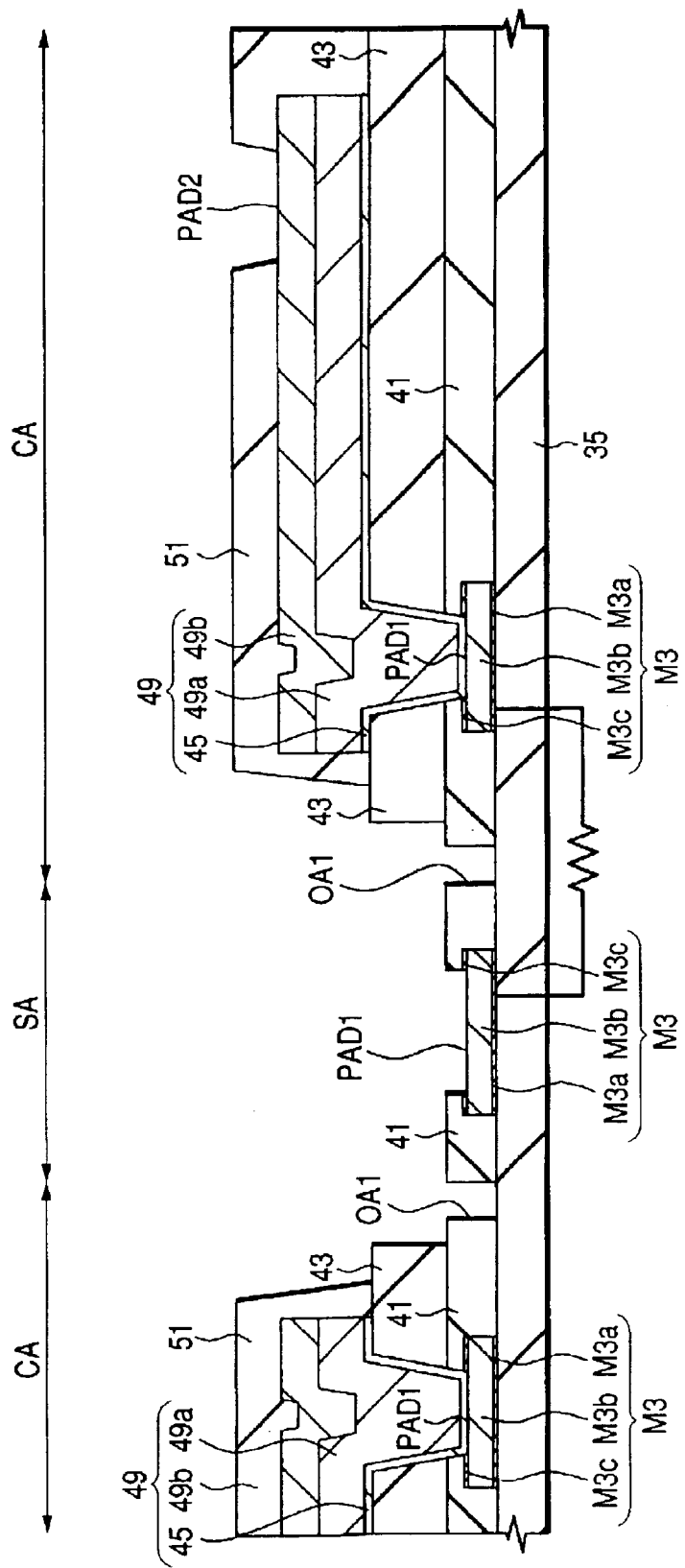
FIG. 22 is a cross sectional view of the essential part of the substrate, for showing the semiconductor integrated circuit device to illustrate the effects of Embodiment 1 of the present invention.

For example, as shown in FIG. 22, it is also possible to remove the TiN film M3c as the surface of the third layer wiring M3, for example, when an opening to expose the first pad portion PAD1 is formed.

However, in this case, the Al alloy film M3b is exposed through the first pad portion PAD1, so that it will be corroded by, for example, a cleaning solution such as HCl.

In contrast to this, in accordance with this embodiment, as described above, since the TiN film M3c which plays a role of a protective film against an acidic cleaning solution remains on the Al alloy film M3b, it is possible to prevent the corrosion of the Al alloy film M3b. Herein, in order to improve the adhesion and the electromigration resistance, other than the TiN film, a single layer film of a Ti film, a TiW film, a Ta film, a W film, or a WN, or a multilayer film of these films is used. However, as the protective film against an acidic cleaning solution, a single layer film of a Ti film, a Ta film, a TaN film, a W film, or a WN film, which has oxidation resistance, or a multilayer film of these films is preferably used. Further, it is sufficient that the film covers the surface of wiring. For example, the film may also be so configured that a Ti film and a TiN film are sequentially stacked on the Al alloy film M3b. Alternatively, as a matter of course, it may also be formed separately as the protective film against an acidic cleaning solution after the formation of wiring and before the cleaning step and the plating step.

Figure 23:
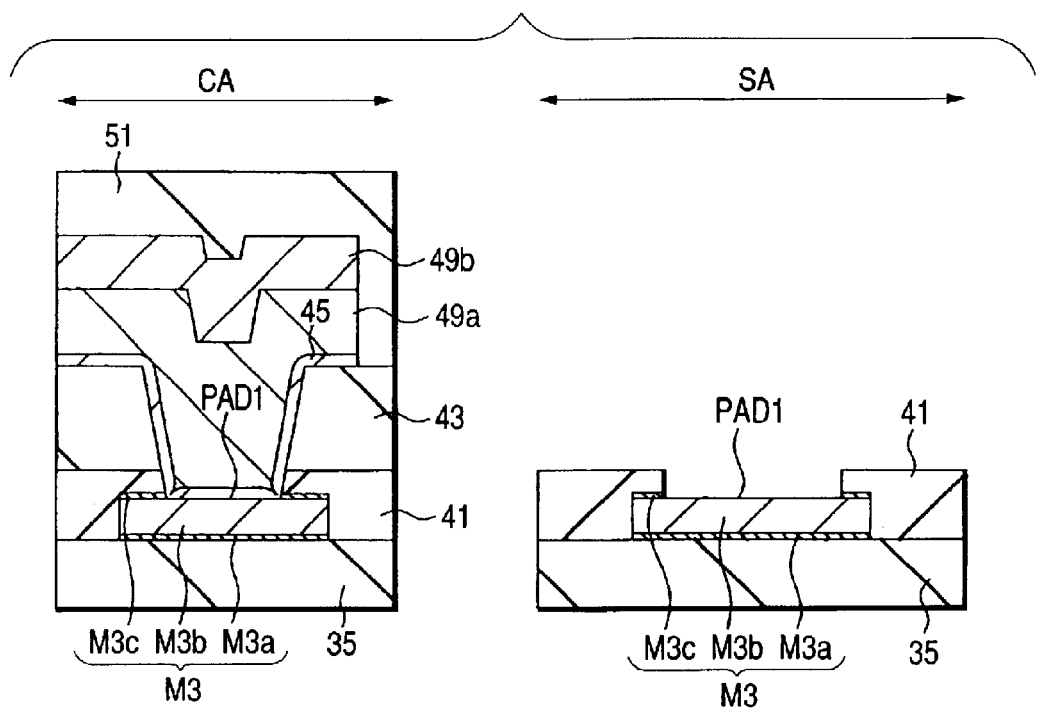
FIG. 23 is a cross sectional view of the essential part of the substrate, for showing the semiconductor integrated circuit device to illustrate the effects of Embodiment 1 of the present invention.

Whereas, when the TiN film M3c as the surface of the third layer wiring M3 has been removed, for example, upon forming an opening to expose the first pad portion PAD1, as shown in FIG. 23, the TiN film M3c as the surface of the third layer wiring M3 in the chip area CA is also removed. In this case, the opening is deepened by the thickness of the TiN film M3c, so that the film forming property of the Cr film or the Cu film constituting the seed layer 45 is degraded at the opening corner portion. In contrast to this, in accordance with this embodiment, as shown in FIG. 24, the difference in level of the opening is reduced, which enables the enhancement of the coverage of the seed layer 45 at the corner portion.

Further, when the TiN film is etched, side etching of the TiN film may occur. Namely, upon forming an opening to expose the first pad portion PAD1, the sidewall of the TiN film M3c is set further back from the sidewall of the opening resulting from the passivation film 41 or the polyimide resin film 43 overlying the TiN film M3c, so that it is formed in an overhang shape. Therefore, if a Cr film or a Cu film (seed layer 45) is formed in such an opening, the coverage at the corner portion is deteriorated, so that step breakage occurs. In particular, the TiN film M3c, the passivation film 41, and the polyimide resin film 43 are etched by using different masks, the sidewall of the TiN film M3c is exposed to under etching over and over again. As a result, it tends to be formed in an overhang shape, so that step breakage becomes more likely to occur. In contrast to this, in accordance with this embodiment, since the TiN film M3c has been allowed to remain as shown in FIG. 24, it is possible to enhance the coverage of the seed layer 45 at the corner portion.

Figure 24:
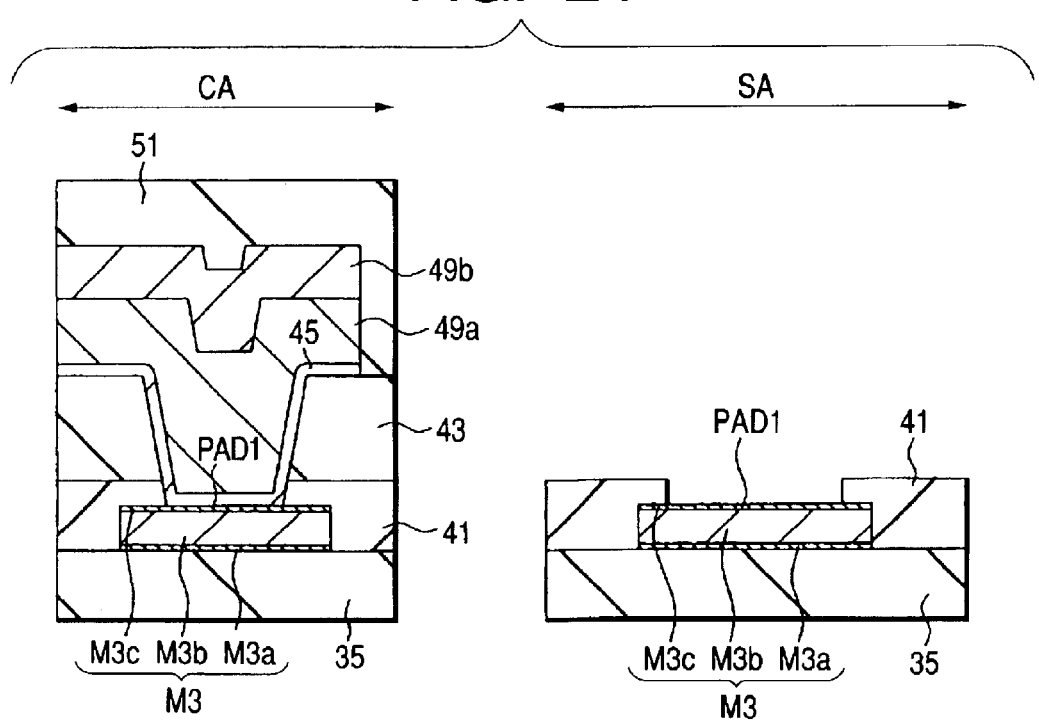
FIG. 24 is a cross sectional view of the essential part of the substrate, for showing a manufacturing process of the semiconductor integrated circuit device which is Embodiment 1 of the present invention.

Incidentally, FIGS. 23 and 24 are partially enlarged views of the vicinity of the first pad portions (PAD1s) of FIGS. 21 and 22, respectively.

Figure 25:
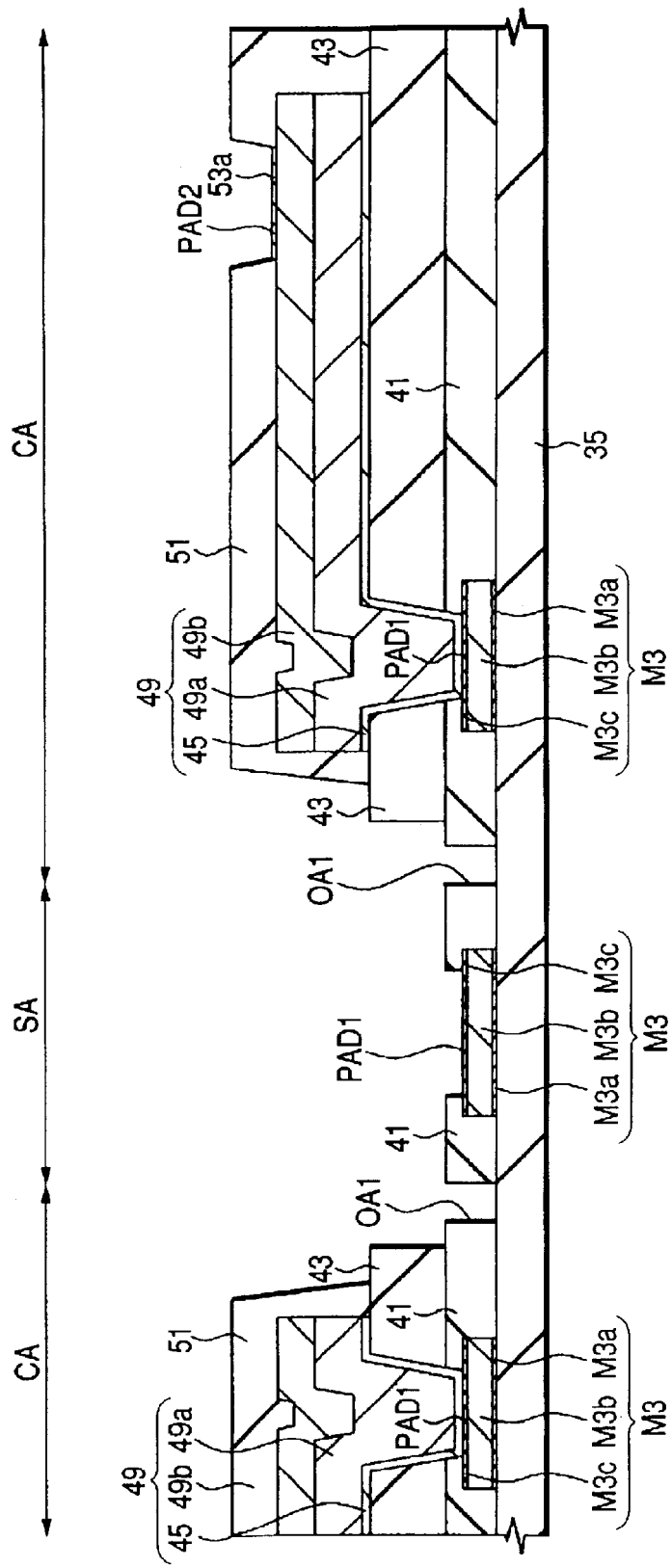
FIG. 25 is a cross sectional view of the essential part of the substrate, for showing a manufacturing process of the semiconductor integrated circuit device which is Embodiment 1 of the present invention.
Figure 26:
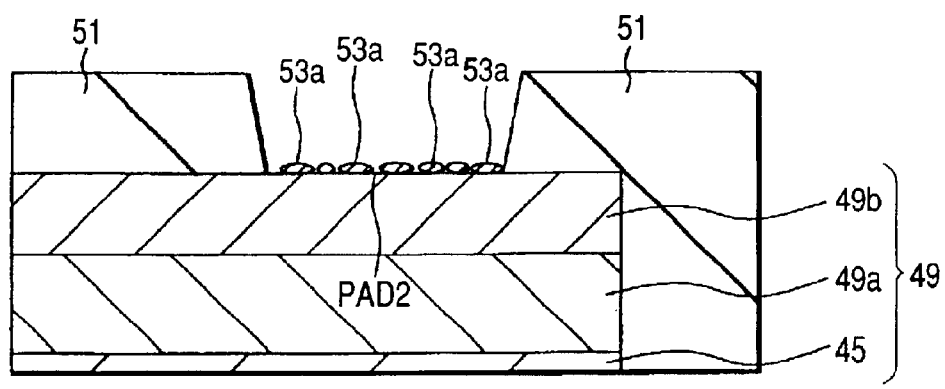
FIG. 26 is a cross sectional view of the essential part of the substrate, for showing a manufacturing process of the semiconductor integrated circuit device which is Embodiment 1 of the present invention.
Figure 30:
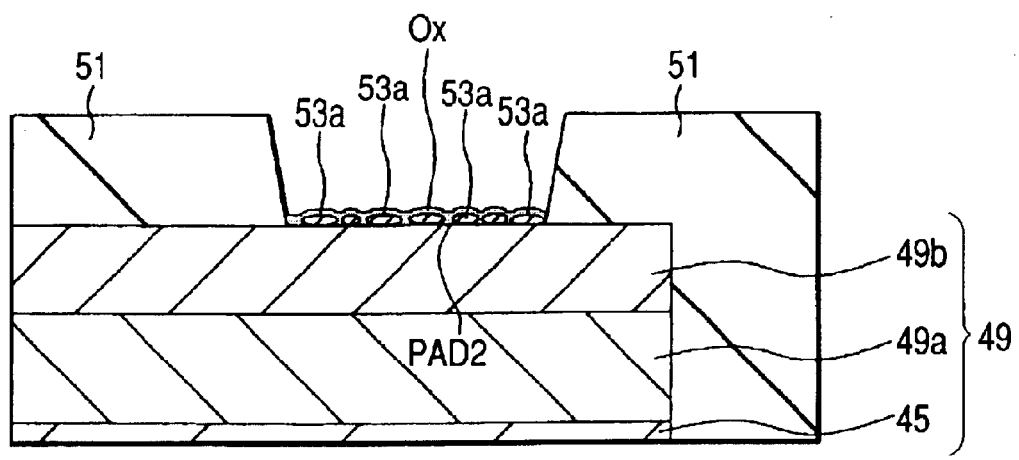
FIG. 30 is a cross sectional view of the essential part of the substrate, for showing a manufacturing process of the semiconductor integrated circuit device which is Embodiment 1 of the present invention.
Figure 31:
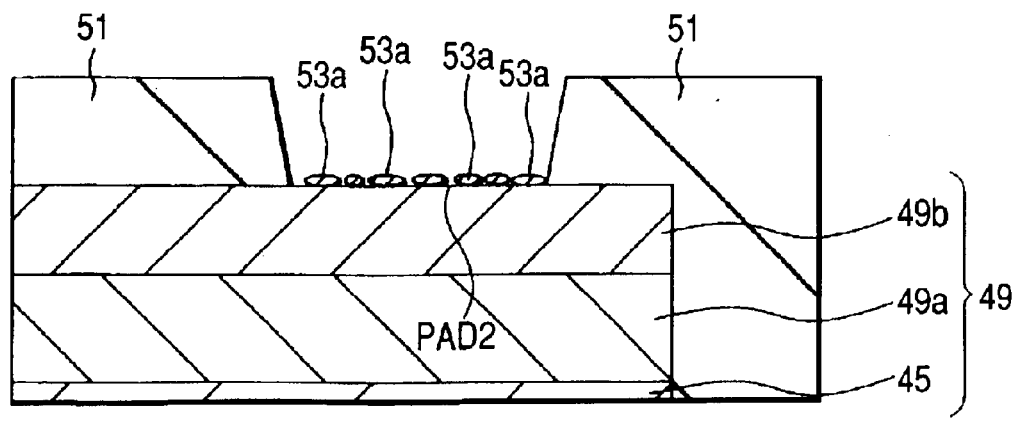
FIG. 31 is a cross sectional view of the essential part of the substrate, for showing a manufacturing process of the semiconductor integrated circuit device which is Embodiment 1 of the present invention.
Figure 32:
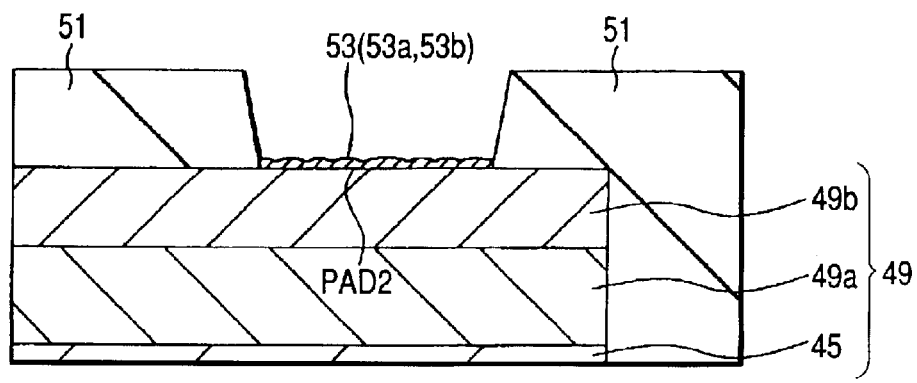
FIG. 32 is a cross sectional view of the essential part of the substrate, for showing a manufacturing process of the semiconductor integrated circuit device which is Embodiment 1 of the present invention.

Then, as shown in FIG. 25, on the Ni film 49 exposed through the second pad portion PAD2, an Au film is deposited with a thickness of about 20 nm to 150 nm by an electroless plating method. As the plating solution, a plating solution for Au, for example, a sodium gold silfite-based plating solution is used to carry out the processing at 55° C. for 10 minutes. With this plating method, displacement between Au and Ni is effected by utilizing the difference in ionization tendency therebetween, thereby to form an Au film 53a. The method is referred to as a displacement plating method among electroless plating methods. Incidentally, in the displacement plating, after Ni on the surface of the Ni film 49b has been displaced by Au to a certain degree, the deposition of Au becomes rate-controlled. For this reason, it is difficult to obtain a thick film (see the graph (a) of FIG. 38). Therefore, as shown in FIG. 26, discontinuous portions (pin holes) tend to be formed in the film. FIG. 26 is a partially enlarged view of the vicinity of the second pad portion (PAD2) of FIG. 25. (FIGS. 30 to 32 are the same)

The Au film 53a is formed on the Ni film 49b of the second pad portion PAD2 in this manner for the following purposes: 1) the contact resistance of a probe to abut on the second pad portion PAD2 for a retention test described later is reduced; and 2) the wettability of a solder bump electrode 55 to be formed on the second pad portion PAD2 is improved. The term "wettability" denotes, for example, when an alloy solder of Sn (tin) and Pb (lead) is mounted on the second pad portion PAD2, the degree of affinity between the alloy solder and the Au film.

Herein, in accordance with this embodiment, although the third layer wiring M3 is exposed in the scribe area SA, the TiN film M3c remains on the surface thereof. Therefore, it is possible to prevent the corrosion of the Al alloy film M3b due to a plating solution (ex., a sodium gold sulfite-based plating solution). Further, it is possible to improve the film quality of the Au film 53a, and thereby to enhance the film forming property.

For example, as shown in FIG. 22, it is also possible to remove the TiN film M3c as the surface of the third layer wiring M3 upon forming an opening to expose the first pad portion PAD1. However, in this case, the Al alloy film M3b is exposed through the first pad portion PAD1, so that the Al alloy film M3b will be corroded (dissolved or oxidized) by a plating solution.

Whereas, when the test utilizing the first pad portion PAD1 has already been completed, it seems that no problem will occur even if the Al alloy film M3b is corroded.

However, if a metal such as Al is dissolved into the plating solution, the plating solution is degraded. As a result, the deposition of the Au film 53a is inhibited, and the film quality of the Au film 53a is degraded.

Further, an electrical connection may be established between the third layer wiring M3 (TiN film M3c) on the scribe area SA and the third layer wiring M3 (TiN film M3c) on the chip area CA (see FIG. 22). In such a case, a cell effect described later is produced, sot that the deposition of the Au film 53a is inhibited in the chip area CA.

With the cell effect, in the scribe area SA, the Al alloy film M3b turns into aluminum ions, and begins to dissolve due to the chlorine ions, and the like in the plating solution. In this process, released electrons affect the Ni film 49b on the chip area CA, and inhibit the activation of the surface. As a result, the deposition rate of the Au film 53a is slowed. Incidentally, this phenomenon may also occur for the cleaning using HCl or the like described above.

In contrast to this, in accordance with this embodiment, since the TiN film M3c remains on the Al alloy film M3b, it is possible to prevent the corrosion of the Al Alloy film M3b, and it is possible to properly activate the surface of the Ni film 49b on the chip area CA. Further, it is possible to maintain the activation. As a result, it is possible to effectively deposit the Au film 53a on the Ni film 49b.

Subsequently, a retention test is carried out. The retention test is for testing the information retention characteristic upon driving a memory cell, and storing electric charges in a control electrode CG. For example, the memory cell is exposed under high temperature (retention bake is performed), thereby to carry out the test at an accelerating rate. Incidentally, the retention test is preferably carried out upon completion of a high-temperature heat treatment step such as the bake of the polyimide resin film 51 or the like. This is for the following reason: if a high-temperature processing step is present after the test, the characteristics may be changed due to such a step.

Figure 27:
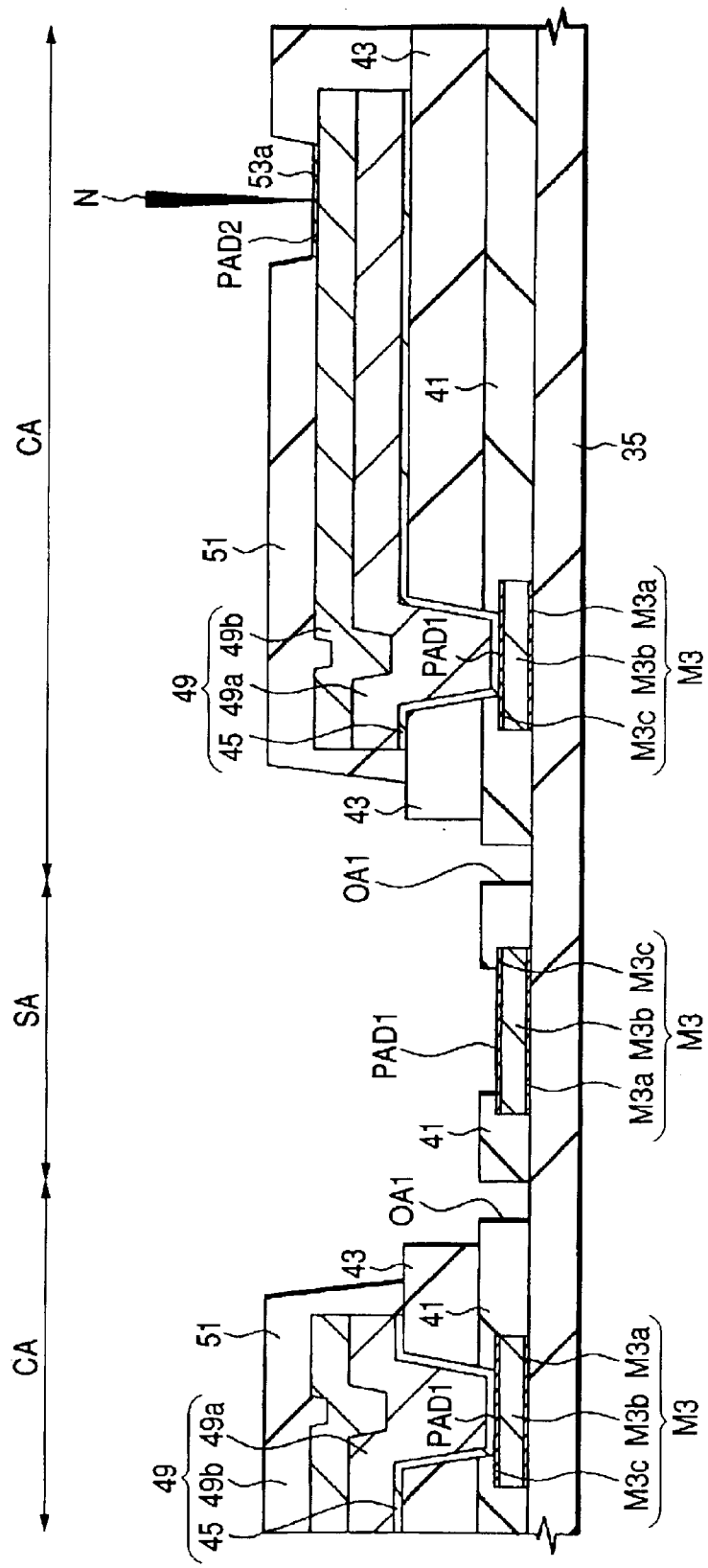
FIG. 27 is a cross sectional view of the essential part of the substrate, for showing a manufacturing process of the semiconductor integrated circuit device which is Embodiment 1 of the present invention.

First, the information retention characteristic at the present step is measured. As shown in FIG. 27, a probe N is allowed to abut on the Au film 53a as the surface of the second pad portion PAD2 to carry out the measurement. Herein, as described above, in accordance with this embodiment, the Au film 53a has been formed with good film forming property, and hence it is possible to carry out the foregoing measurement with high accuracy.

Figure 28:
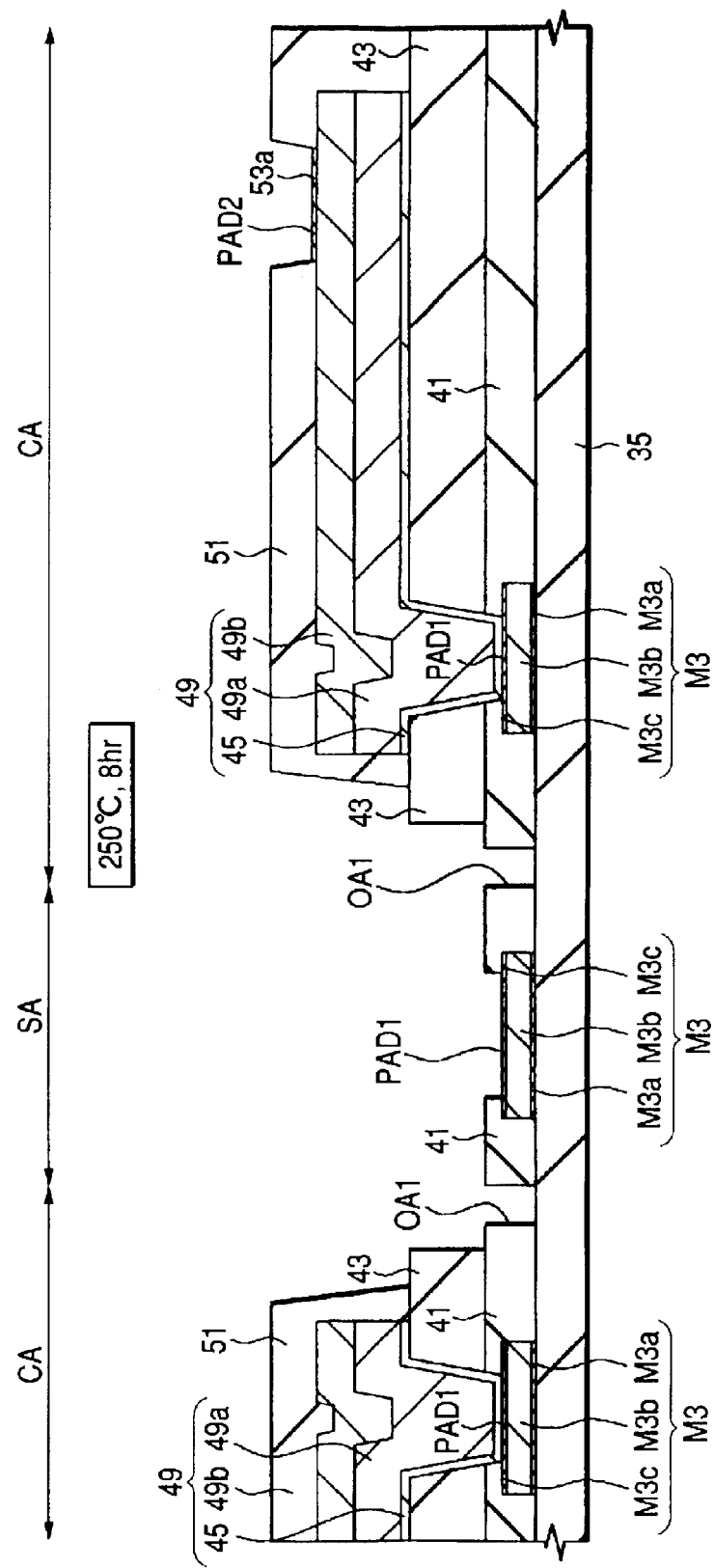
FIG. 28 is a cross sectional view of the essential part of the substrate, for showing a manufacturing process of the semiconductor integrated circuit device which is Embodiment 1 of the present invention.

Then, as shown in FIG. 28, the substrate 1 (semiconductor wafer) is exposed to, for example, under a temperature of 250° C. for 8 hours (retention bake).

Figure 29:
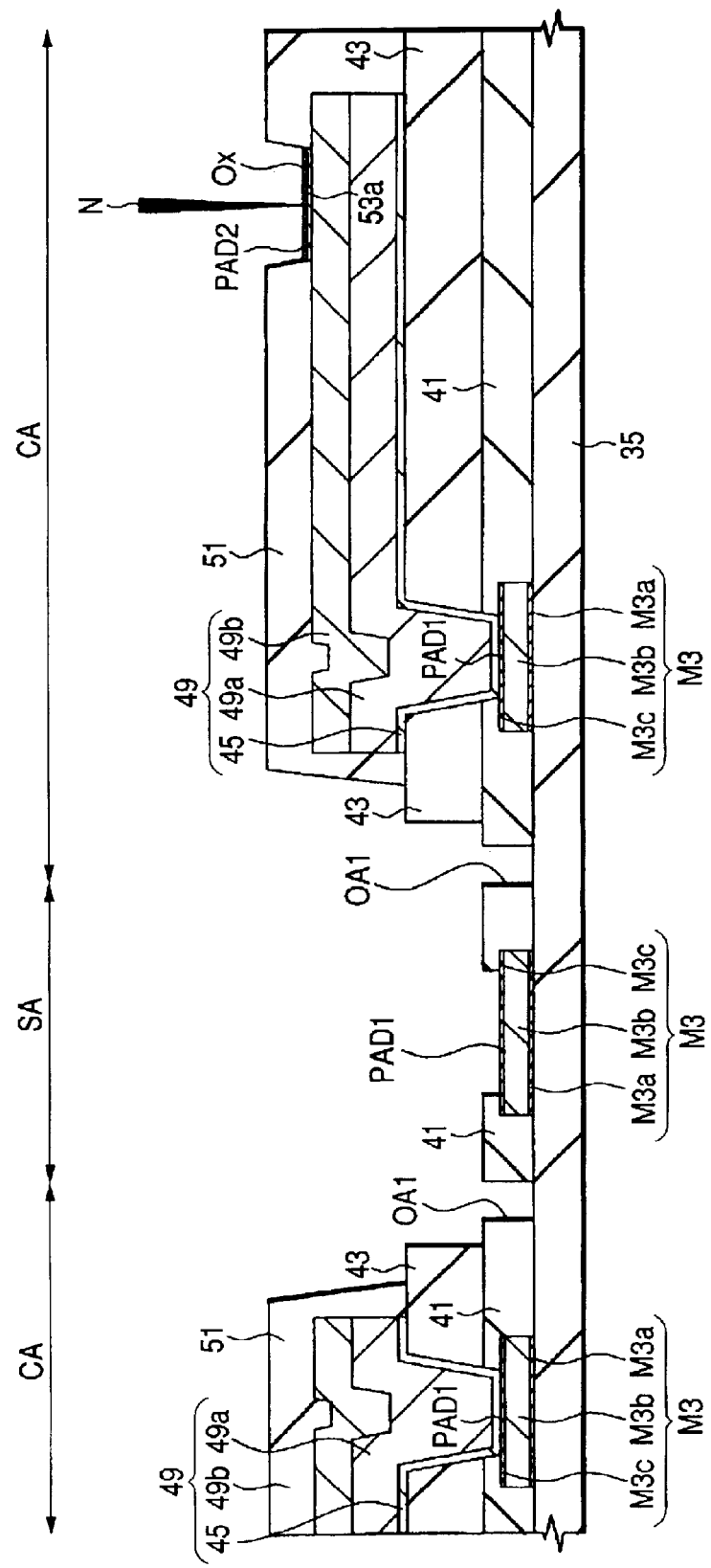
FIG. 29 is a cross sectional view of the essential part of the substrate, for showing a manufacturing process of the semiconductor integrated circuit device which is Embodiment 1 of the present invention.

Then, the information retention characteristics after the retention bake are measured. Namely, as shown in FIG. 29, a probe N is allowed to abut on the Au film 53a as the surface of the second pad portion PAD2 to carry out the measurement. Incidentally, the foregoing TEG evaluation may also be carried out before or after the retention test.

Then, although bump electrodes are formed on the Au film 53a as the surface of the second pad portion PAD2, the present inventors have conducted the following study.

On the Au film 53a (FIG. 29), a solder bump electrode 55 was formed, and the wettability of the solder was found to be poor, and defective. At this step, the thickness of the Au film 53a was 55 nm.

In contrast to this, on the Au film 53a (FIG. 27) before the retention bake, a solder bump electrode 55 was formed, and the wettability of the solder was not found to be poor, and the shear strength of the solder bump electrode 55 was also found to be good.

Accordingly, the present inventors have come to a conclusion that the degradation in surface conditions of the second pad portion PAD2 due to the retention bake may be deeply involved in the foregoing defect. Thus, they conducted a study on the conditions, and improved the wettability of the solder and the shear strength of the solder bump electrode 55 by the following steps.

First, the surface of the substrate 1 is cleaned by using an acidic cleaning solution such as HCl (hydrogen chloride). The reason for carrying out the cleaning will be described below.

Namely, as shown in FIG. 30, if a heat treatment at more than 200° C. in air, such as retention bake has been performed, Ni is exposed through the discontinuous portions (pin holes) of the Au film 53a, so that an oxide film Ox is formed. Further, an oxide film is formed on the pin holes, and at the interface between the Au film 53a and the Ni film 49b by oxygen penetrated through the discontinuous portions (pin holes) of the Au film 53a.

Figure 39:
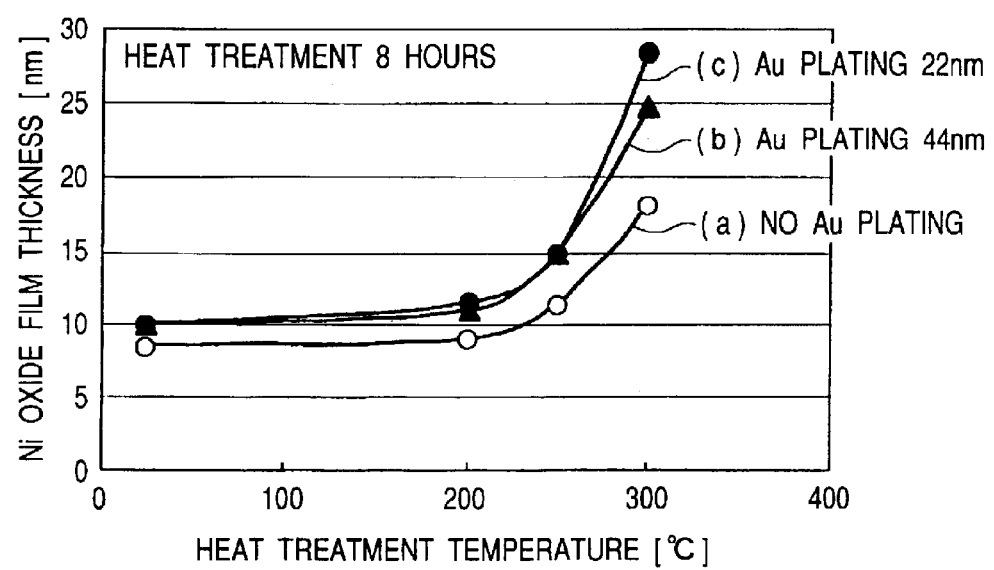
FIG. 39 is a diagram for showing the relationship between the heat treatment temperature [° C.] and the oxide film thickness [nm]

FIG. 39 shows the relationship between the heat treatment temperature [° C.] and the oxide film thickness [nm]. A graph (a) shows the case where no Au film has been formed; a graph (b), the case where a 44 nm-thick Au film has been formed; and a graph (c),the case where a 22 nm-thick Au film has been formed. It is noted that the heat treatment time has been 8 hours.

As shown in the graphs (a) to (c), the thickness of the oxide film increases with an increase in heat treatment temperature. Any of the graphs (a) to (c) indicates that the thickness of the resulting oxide film begins to show a sharp increase at around more than 200° C. Whereas, as for the Ni film on which the Au film is formed, it has been shown that, the smaller the thickness of the Au film is, the larger the thickness of the oxide film tends to be. Incidentally, it has been shown that the thickness of the oxide film tends to be larger on the Ni film surface (on which an Au film has been formed) than on the surface of the Ni film on which no Au film has been formed. This is presumably due to the following reason. When the Au film is thin, the Au film is in the form of islands. Therefore, the surface becomes uneven, resulting in a larger surface area. Ni in the Ni film diffuses into the surface, and adsorbs oxygen. As a result, the deposition of the Au film thereon rather increases the oxide film thickness.

The presence of such an oxide film Ox deteriorates the solder wettability for solder mounting, and further deteriorates the shear strength of the solder bump electrode. The shear strength denotes, for example, the stress to be imposed the solder bump electrode 55 until peeling or destruction thereof is caused upon mechanically applying a lateral stress to the solder bump electrode 55. Then, as described previously, for example, cleaning is carried out using a 20% hydrochloric acid (HCl) at 25° C. for 5 minutes to remove the oxide film (FIG. 31).

Then, as shown in FIG. 32, the top of the Au film 53a on the second pad portion PAD2 is subjected to displacement plating, thereby to deposit an Au film 53b. As a result, an underlayer 53 composed of a multilayer film of the Au films 53a and 53b is formed. The thickness of the multilayer film is, for example, about 85 nm. Incidentally, the further growth of the Au film 53b on the Au film 53a in this manner is considered to be due to the following fact. Namely, Ni under the pin holes (discontinuous portions) of the Au film 53a is displaced by Au, and Ni ions present on the surface of the Au film 53a are displaced by Au. The Au film (53a, 53b) after the second plating processing was observed under a TEM (transmission electron microscope), and found to be a continuous film as shown in FIG. 32.

Whereas, also in the process of the cleaning or the displacement plating, it is possible to prevent the corrosion of the Al alloy film M3b because the TiN film M3c remains on the Al alloy film M3b on the scribe area SA. Accordingly, it is possible to properly carry out the activation of the surface of the Ni film 49b on the chip area CA.

Incidentally, annealing (heat treatment) may also be carried out in order to stabilize the boundary between the Au film (underlayer film 53) and the Ni film.

Figure 33:
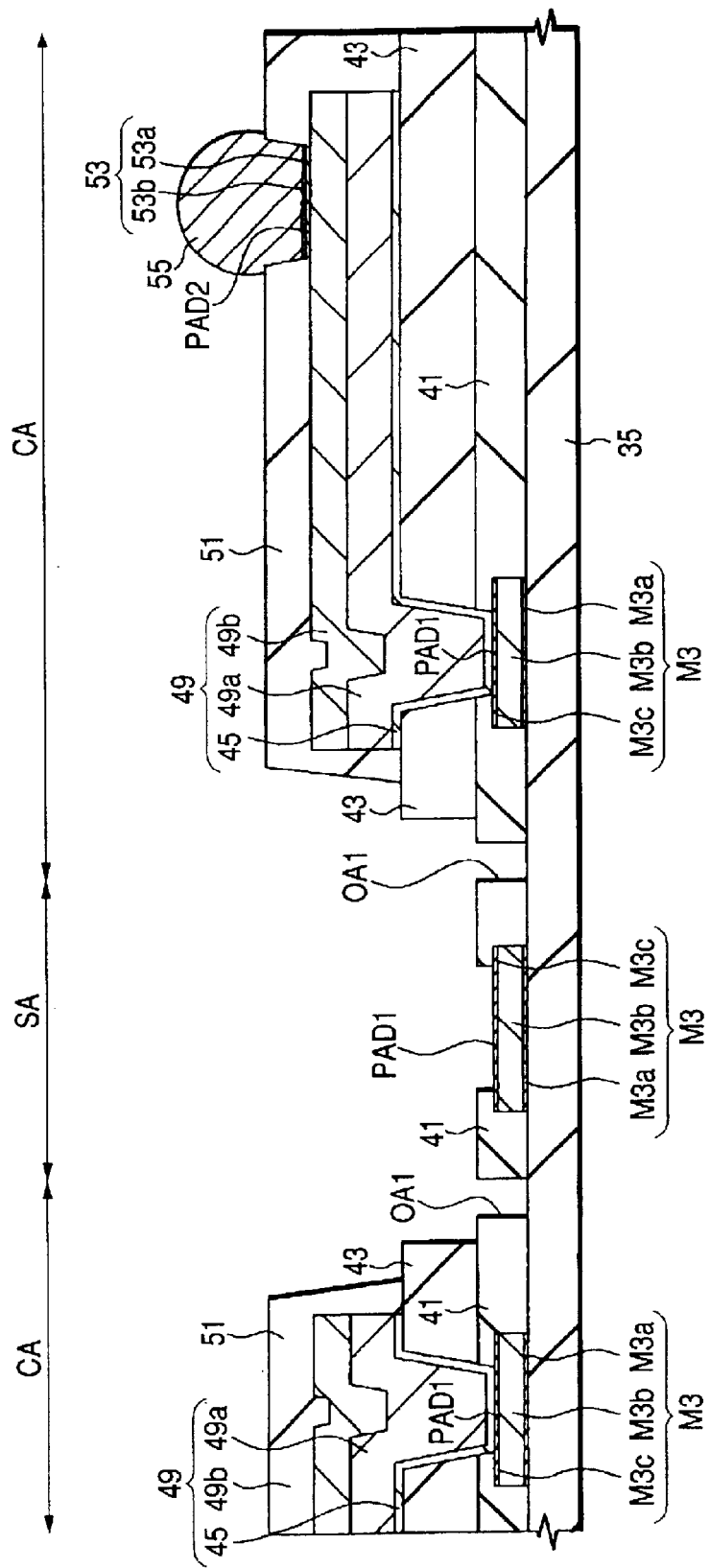
FIG. 33 is a cross sectional view of the essential part of the substrate, for showing a manufacturing process of the semiconductor integrated circuit device which is Embodiment 1 of the present invention.

Thereafter, as shown in FIG. 33, a bump electrode 55 composed of a Sn/Pb alloy solder is connected onto the underlayer film 53. The bump electrode 55 is formed by, for example, a printing method, or a ball transfer method. Incidentally, in FIG. 33, the Au films 53a and 53b are shown for convenience of understanding of the description. However, the Au films 53a and 53b are absorbed into the solder after solder mounting.

Thus, in accordance with this embodiment, the oxide film Ox on the second pad portion PAD2 has been removed, and hence it is possible to improve the wettability of the solder. Moreover, after retention bake, the Au film 53b has been further formed on the Au film 53a. As a result, it is possible to reduce the discontinuous portions (pin holes) of the Au film, and it is possible to improve the wettability of the solder. Further, it is possible to improve the shear strength of the solder bump electrode 55. For example, under the foregoing conditions, it was possible to obtain a shear strength of 250 gf/bump.

Herein, the present inventors have also conducted a study on a method in which the displacement plating processing time is increased, so that the thickness of the Au film is set to be, for example, about 74 nm (about twice the thickness of the Au film 53a), and as a result, the number of pin holes is reduced to inhibit the formation of the Ni oxide film Ox. In this case, as shown in FIG. 37, a processing time of 1900 seconds or more is required for ensuring a film thickness of about 70 nm.

However, the poor solder wettability also occurred in this case. Further, there occurred a defect such as the occurrence of peeling of the solder bump electrode 55 at the interface with the Ni film.

Figure 37:
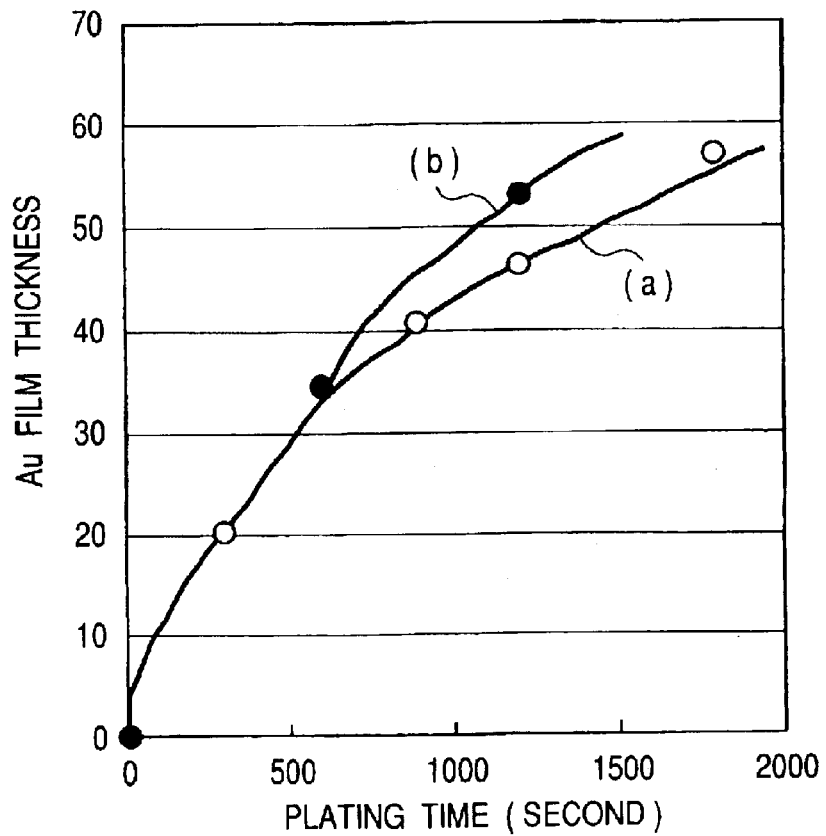
FIG. 37 is a diagram for showing the relationship between the plating time and the film thickness of Au.

FIG. 37 shows the relationship between the plating time and the film thickness of Au. As shown in the graph (a), the film thickness of Au increases with an increase in plating time. In this embodiment, for example, in the first stage (ex., 700 seconds) shown by the graph (a), the Au film 53a is formed. Then, the Au film 53b is formed by the processing shown in the graph (b). By forming a film through two stages in this manner, it is possible to ensure a desired film thickness for a shorter time than with the case of continuous processing (graph (a)).

Figure 40:
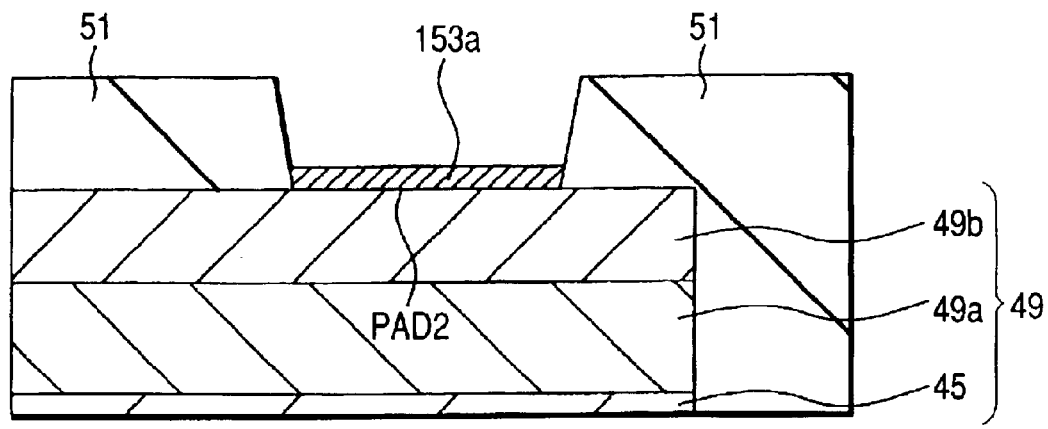
FIG. 40 is a cross sectional view of the essential part of the substrate, for showing a manufacturing process of the semiconductor integrated circuit device to illustrate the effects of Embodiment 1 of the present invention.

Further, the present inventors have also conducted a study on the prevention of the formation of pin holes, and the exposure of the Ni film 49b and the oxidation thereof by forming, for example, an about 1000 nm-thick Au film 153a as shown in FIG. 40.

Figure 41:
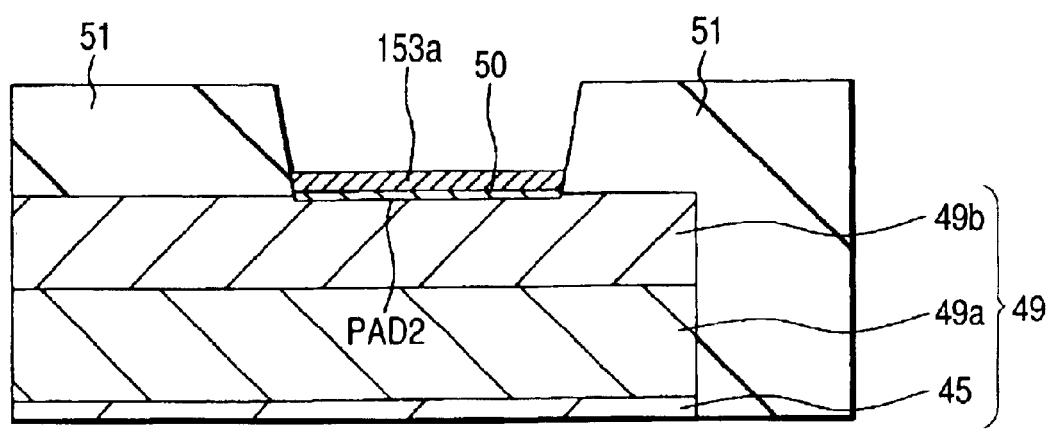
FIG. 41 is a cross sectional view of the essential part of the substrate, for showing a manufacturing process of the semiconductor integrated circuit device to illustrate the effects of Embodiment 1 of the present invention.

However, in this case, it is difficult to use the foregoing displacement plating method. For example, it is necessary to employ a(n) (autocatalysis type plating) method in which a plated film is formed thick by adding a reducing agent into a plating solution. In this case, the plating solution tends to become unstable, so that it is not possible to obtain a film with good quality. Further, there is a high possibility that the plated film is abnormally deposited other than on the Ni film 49b surface. Still further, the plating solution is required to be frequently exchanged in order to ensure the film quality, resulting in a higher cost. Furthermore, after performing retention bake, as shown in FIG. 41, an alloy layer 50 of Au and Ni is formed between the Au film 153a and the Ni film 49b, which makes it impossible for the solder to penetrate into the underlying portion. As a result, peeling of the solder bump electrode 55 becomes more likely to occur at such an interface. Thus, the shear strength of the solder bump electrode 55 is degraded.

In contrast to this, in accordance with this embodiment, it is possible to improve the shear strength of the solder bump electrode 55 as described previously.

Figure 38:
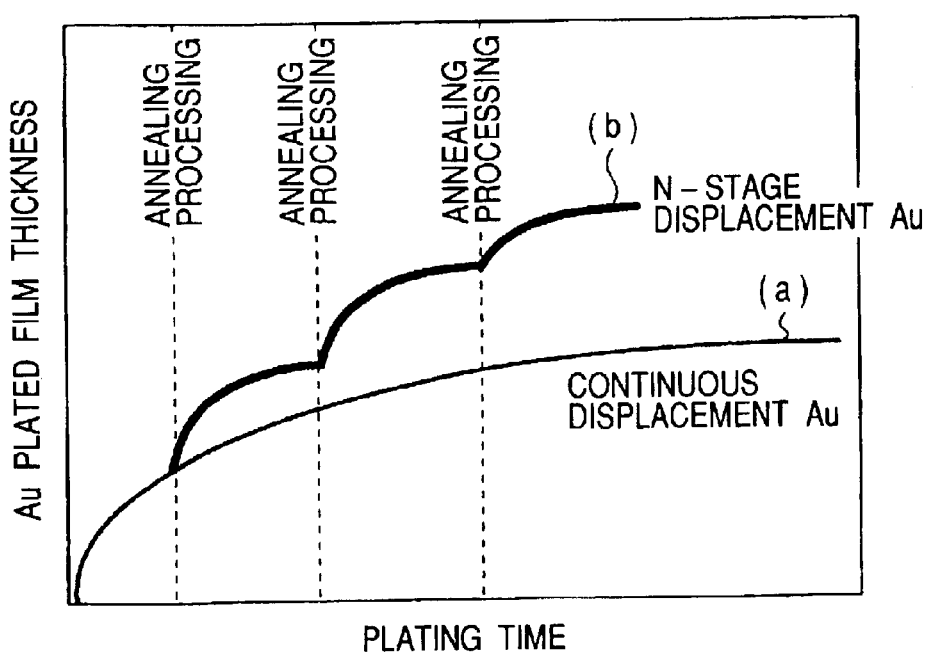
FIG. 38 is a diagram for showing the relationship between the plating time and the film thickness of Au.

Incidentally, as shown in FIG. 38, the plating processing is not required to be carried out through two stages, but a plated film may be formed through 3 or more stages (graph (b)). In this case, it is possible to form even a film, which cannot be formed because the reaction becomes rate-limited, with the continuous processing (graph (a)).

Figure 35:
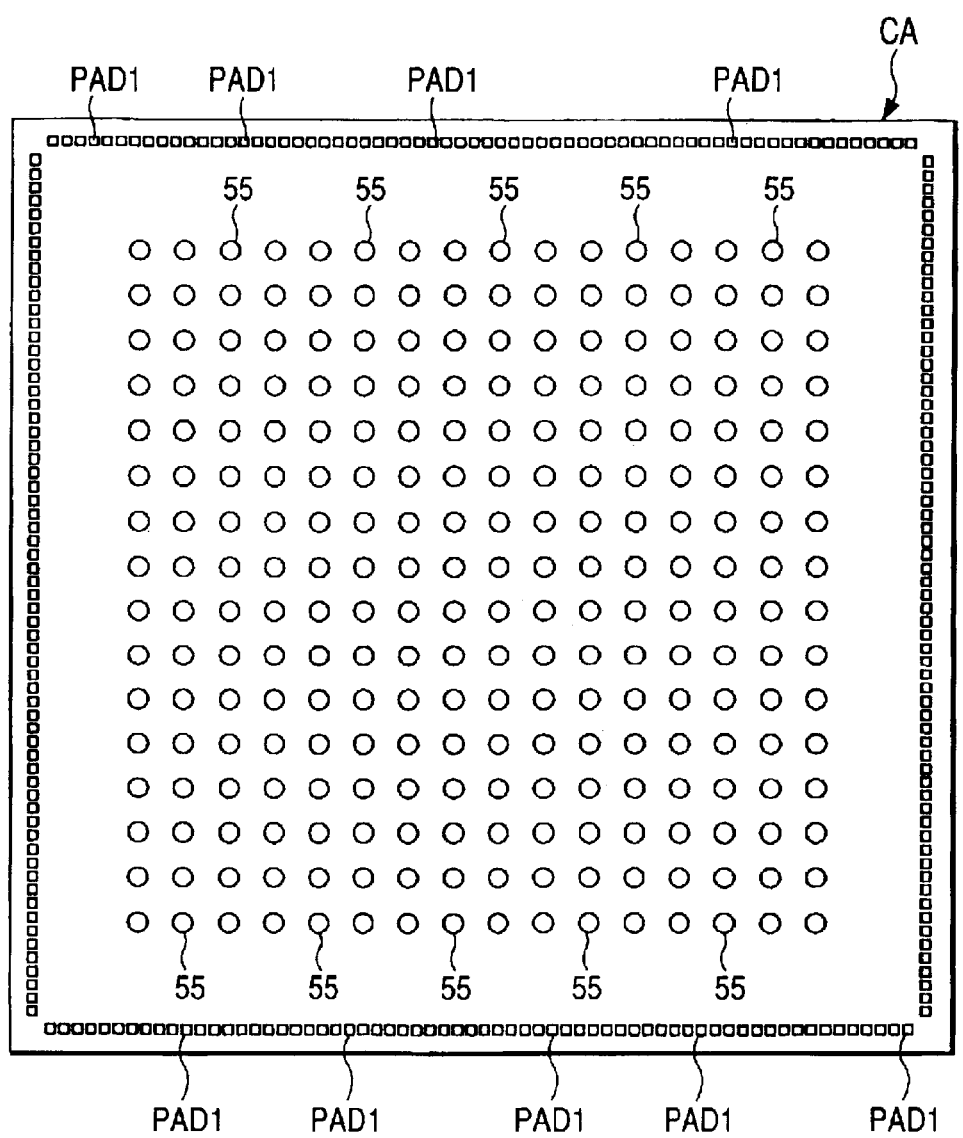
FIG. 35 is a plan view of a chip after the formation of the bump electrodes of the semiconductor integrated circuit device which is Embodiment 1 of the present invention.

FIG. 34 is an overall plan view of the semiconductor wafer (semiconductor substrate) 1 upon completion of the formation of the bump electrodes 55. Thereafter, the wafer 1 is subjected to dicing, and divided into a plurality of individual chips CAs (FIG. 35). Incidentally, the first pad portions arranged along the perimeter of the chip CA are connected to their respective bump electrodes 55 through rewiring (not shown).

Figure 36:
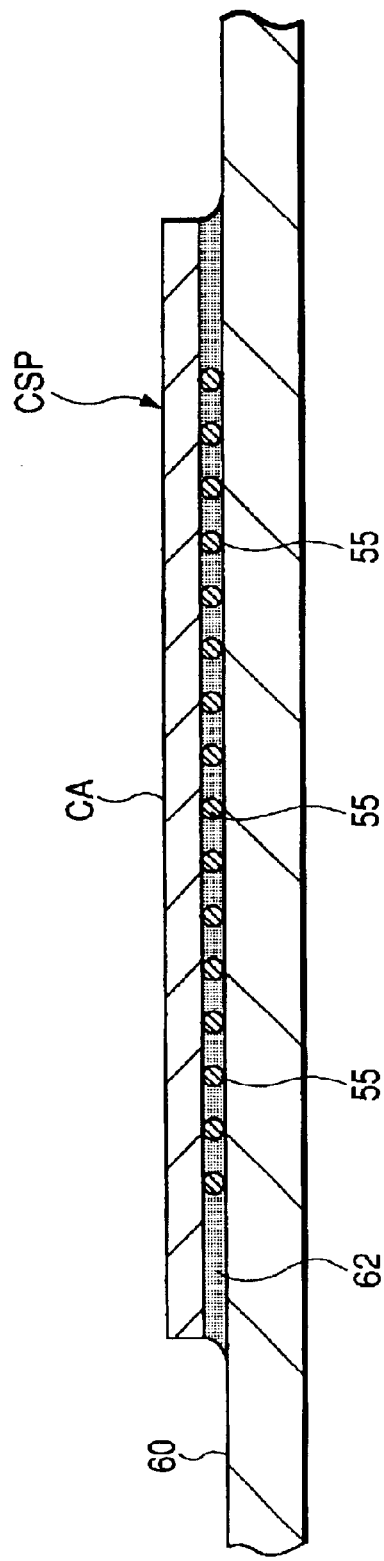
FIG. 36 is a cross sectional view for showing the state in which the semiconductor integrated circuit device (chip) which is Embodiment 1 of the present invention has been mounted on a mounting substrate.

FIG. 36 is a cross sectional view showing a state in which the chip CA is mounted on a mounting substrate 60. For example, the chip CA is bonded face down onto the mounting substrate 60, and the bump electrodes 55 are subjected to heating reflow. Then, an underfill resin 62 is filled in the gap between the chip CA and the mounting substrate 62, thereby to complete a CSP.

Incidentally, in this embodiment, a description has been given taking the recovery of the degraded Au film 53a by retention bake as an example. However, the method of this embodiment is also applicable to the recovery of the Au film 53a which was scratched by a probe or the like, and of which the surface conditions were deteriorated.

Embodiment 2

In Embodiment 1, the third layer wiring M3 was formed by using an Al alloy film, but may also be formed by using a Cu film. Incidentally, it is possible to form the layers lower than the third layer wiring M3, for example, the silicon dioxide film 35, and a plug in the inside thereof, in the same manner as in Embodiment 1. Therefore, a description thereon is omitted.

Figure 42:
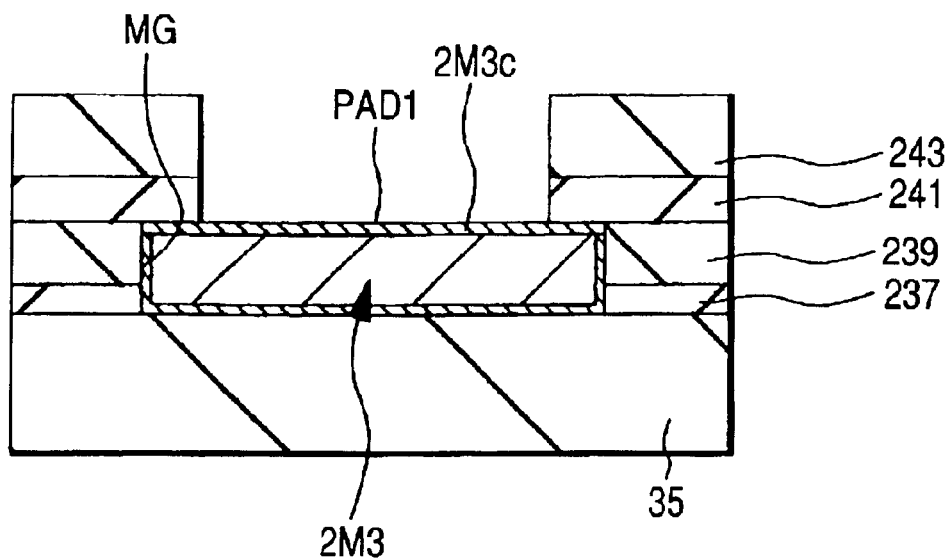
FIG. 42 is a cross sectional view of the essential part of a substrate, for showing a manufacturing process of a semiconductor integrated circuit device which is Embodiment 2 of the present invention.

First, as shown in FIG. 42, on the silicon dioxide film 35, a silicon nitride film 237 and a silicon dioxide film 239 are sequentially deposited as insulating films by using, for example, a CVD method.

Then, the silicon nitride film 237 and the silicon dioxide film 239 are dry etched, thereby to form a wiring groove MG. Incidentally, the silicon nitride film 237 serves as an etching stopper.

Then, on the silicon dioxide film 239 including the inside of the wiring groove MG, a tantalum nitride (TaN) film is deposited as a barrier film by, for example, a sputtering method. Then, a Cu film is formed as a conductive film on the TaN film with a plating method or a CVD method.

Then, the portions of the TaN film and the Cu film outside the wiring groove MG are removed by a CMP method, thereby to form a third layer wiring 2M3. In this step, the Cu film and the like are overpolished, so that the surface thereof is set back further from the surface of the silicon dioxide film 239.

Then, on the silicon dioxide film 239 and the third layer wiring 2M3, a TiN film 2M3c is formed by, for example, a CVD method, and the TiN film 2M3c on the silicon dioxide film 239 is removed. As a result, the surface of the third layer wiring 2M3 is covered with the TiN film 2M3c.

Then, on the silicon dioxide film 239 and the third layer wiring 2M3 (TiN film 2M3c), a silicon nitride film 241 and a silicon dioxide film 243 are sequentially deposited as insulating films by, for example, a CVD method, thereby to form a passivation film composed of a multilayer film of these films.

Then, the portions of the silicon nitride film 241 and the silicon dioxide film 243 on the third layer wiring 2M3 (TiN film 2M3c) are removed by etching, so that an opening to expose the first pad portion PAD1 is formed. Thereafter, a rewiring and a bump electrode are formed in the same manner as in Embodiment 1.

Thus, in accordance with this embodiment, the TiN film 2M3c is formed as the surface of the third layer wiring 2M3. Therefore, even if the third layer wiring 2M3 (TiN film 2M3c) on the scribe area SA is exposed, it is possible to obtain the effects as described in detail in Embodiment 1, such as prevention of the corrosion of the underlying Cu film due to processings of acid cleaning, plating, and the like.

Further, after the formation of an opening to expose the first pad portion PAD1, a TiN film 244 may also be formed in the opening.

Figure 43:
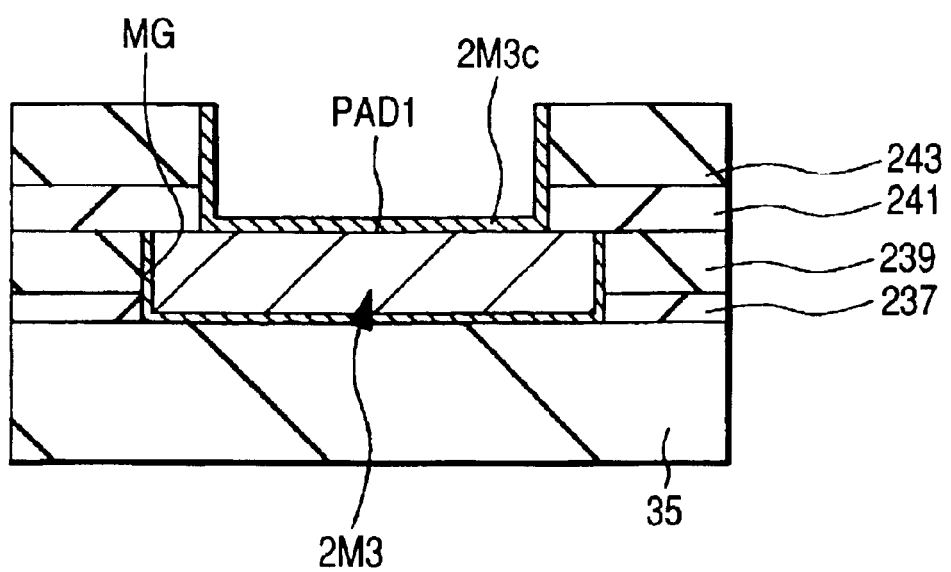
FIG. 43 is a cross sectional view of the essential part of a substrate, for showing a manufacturing process of a semiconductor integrated circuit device which is Embodiment 2 of the present invention.

Namely, as shown in FIG. 43, on the silicon dioxide film 239 and the third layer wiring 2M3, a passivation film composed of a multilayer film of the silicon nitride film 241 and the silicon dioxide film 243 is formed as an insulating film. The film is then removed by etching, so that an opening to expose the first pad portion PAD1 is formed.

Then, on the silicon dioxide film 243 including the inside of the opening, the TiN film 244 is deposited by, for example, a CVD method. Subsequently, the portion of the TiN film 244 on the silicon dioxide film 243 is removed by a CMP method, so that the TiN film 244 is left on the sidewall and the bottom (first pad portion PAD1) of the opening. Thereafter, a rewiring and a bump electrode are formed in the same manner as in Embodiment 1.

Also in this case, even if the third layer wiring 2M3 on the scribe area SA is exposed, it is possible to obtain the effects as described in detail in Embodiment 1, such as prevention of the corrosion of the underlying Cu film due to processings of acid cleaning, plating, and the like because the TiN film 244 has been formed thereon.

Further, the Cu film forms a modified layer by contact with a polyimide resin film. Therefore, it is possible to prevent the formation of the modified layer by the TiN films (2M3c and 244).

Up to this point, the present invention completed by the present inventors has been described specifically by way of embodiments, which should not be construed as limiting the scope of the present invention. It is needless to say that various changes and modifications may be made without departing from the scope of the invention.

In particular, in the foregoing embodiments, a description was given by taking a NOR type non-volatile memory as an example. However, the present invention is also widely applicable to semiconductor integrated circuit devices other than AND type, NAND type, and other types of non-volatile memories.

The effects obtainable in accordance with the typical aspects of the present invention disclosed in this application will be briefly described as follows.

(1) A first wiring is formed on a chip area of a semiconductor wafer, and a pattern for test is formed on a scribe area thereof. These are composed of a first conductive film and a second conductive film thereon. Therefore, even if, after the formation of a second wiring on the first wiring via an insulating film, a pad area as the top of the second wiring is cleaned, or a plated film is formed thereon, it is possible to prevent the corrosion of the pattern for test because the surface of the pattern for test is covered with the second conductive film. Further, it is possible to properly evaluate a semiconductor integrated circuit device by using the pattern for test. Further, by preventing the corrosion of the pattern for test, it is possible to avoid poor plating in the chip area where an actual device is formed. Further, it is possible to improve the characteristics of the semiconductor integrated circuit device.

(2) On the pad area of the first wiring electrically connected to a semiconductor element formed on the semiconductor wafer, the first conductive film is formed. The semiconductor wafer is subjected to a heat treatment to test the characteristics of the semiconductor element by utilizing the pad area. Thereafter, the second conductive film is further formed on the first conductive film. Therefore, it is possible to improve the wettability for solder mounting and the shear strength after solder formation. Further, it is possible to improve the characteristics of the semiconductor integrated circuit device.

What is claimed is:

1. A method of manufacturing a semiconductor integrated circuit device, comprising the steps of:
   (a) forming a first wiring having a first conductive film and a second conductive film thereon in a chip area of a semiconductor wafer, and forming a pattern for test having the first conductive film and the second conductive film thereon in a scribe area of the semiconductor wafer;
   (b) forming a second wiring on the first wiring via an insulating film; and
   (c) cleaning a pad area which is a part of the second wiring with the second conductive film as the surface of the pattern for test being exposed.

2. The method of manufacturing a semiconductor integrated circuit device according to claim 1, wherein the first conductive film contains Al (aluminum) or Cu (copper) as a main component.

3. The method of manufacturing a semiconductor integrated circuit device according to claim 1, wherein the second conductive film is comprised of a single layer film of a TiN (titanium nitride) film, a Ta (tantalum) film, a TaN (tantalum nitride) film, a W (tungsten) film or a WN (tungsten nitride) film, or a multilayer film of these films.

4. The method of manufacturing a semiconductor integrated circuit device according to claim 1, wherein the cleaning is carried out by using an acidic cleaning solution.

5. The method of manufacturing a semiconductor integrated circuit device according to claim 1, further comprising: subsequent to the step (c), a step (d) of carrying out an evaluation of the pattern for test or a portion electrically connected to the pattern for test by using the pattern for test.

6. The method of manufacturing a semiconductor integrated circuit device according to claim 1, wherein the first wiring is electrically connected to the pattern for test.

* * * * *